US008032844B2

(12) United States Patent
Hoshino

(10) Patent No.: US 8,032,844 B2
(45) Date of Patent: Oct. 4, 2011

(54) SEMICONDUCTOR DEVICE MANUFACTURING METHOD, DATA GENERATING APPARATUS, DATA GENERATING METHOD AND RECORDING MEDIUM READABLE BY COMPUTER RECODED WITH DATA GENERATING PROGRAM

(75) Inventor: Hiromi Hoshino, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 811 days.

(21) Appl. No.: 11/844,541

(22) Filed: Aug. 24, 2007

(65) Prior Publication Data
US 2008/0050676 A1 Feb. 28, 2008

(30) Foreign Application Priority Data

Aug. 25, 2006 (JP) .................. 2006-229901

(51) Int. Cl.
*G06F 17/50* (2006.01)
(52) U.S. Cl. ............. 716/53; 716/55; 716/132; 716/139
(58) Field of Classification Search .................... 716/53, 716/55, 132, 139; 703/14
See application file for complete search history.

(56) References Cited

U.S. PATENT DOCUMENTS

| 6,370,441 | B1 * | 4/2002 | Ohnuma ................. 700/121 |
| 7,257,790 | B2 * | 8/2007 | Maeda ..................... 716/10 |
| 7,382,447 | B2 * | 6/2008 | Mieher et al. ............ 356/125 |

FOREIGN PATENT DOCUMENTS

| JP | 9246144 A | 9/1997 |
| JP | 10125574 A | 5/1998 |
| JP | 11111594 A | 4/1999 |

* cited by examiner

*Primary Examiner* — Thuan Do
(74) *Attorney, Agent, or Firm* — Fujitsu Patent Center

(57) ABSTRACT

A semiconductor manufacturing method comprising, a data generating process including, acquiring a simulation light pattern that simulates a shape of a light exposure pattern formed on a substrate on the basis of design data of a semiconductor device, acquiring a simulation electron beam exposure pattern that simulates a shape of an electron beam exposure pattern formed by an electron beam exposure on the substrate on the basis of the design data, extracting difference information representing a shape difference portion between the simulation light pattern and the simulation electron beam exposure pattern, acquiring changed design data for modifying shape by changing the design data in accordance with the difference information, conducting the electron beam exposure on the substrate by use of the changed design data for modifying the shape.

19 Claims, 24 Drawing Sheets

FIG.5B
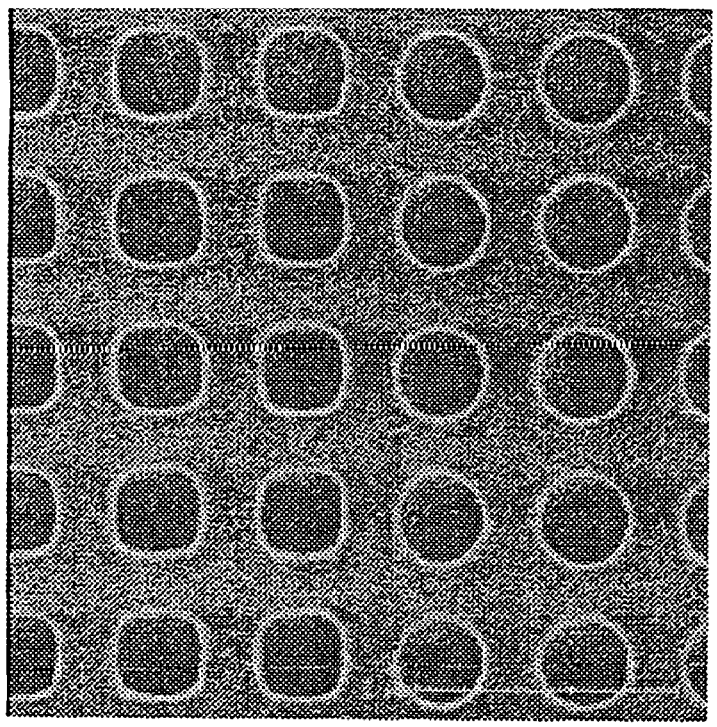
PRE-REPLACEMENT    POST-REPLACEMENT

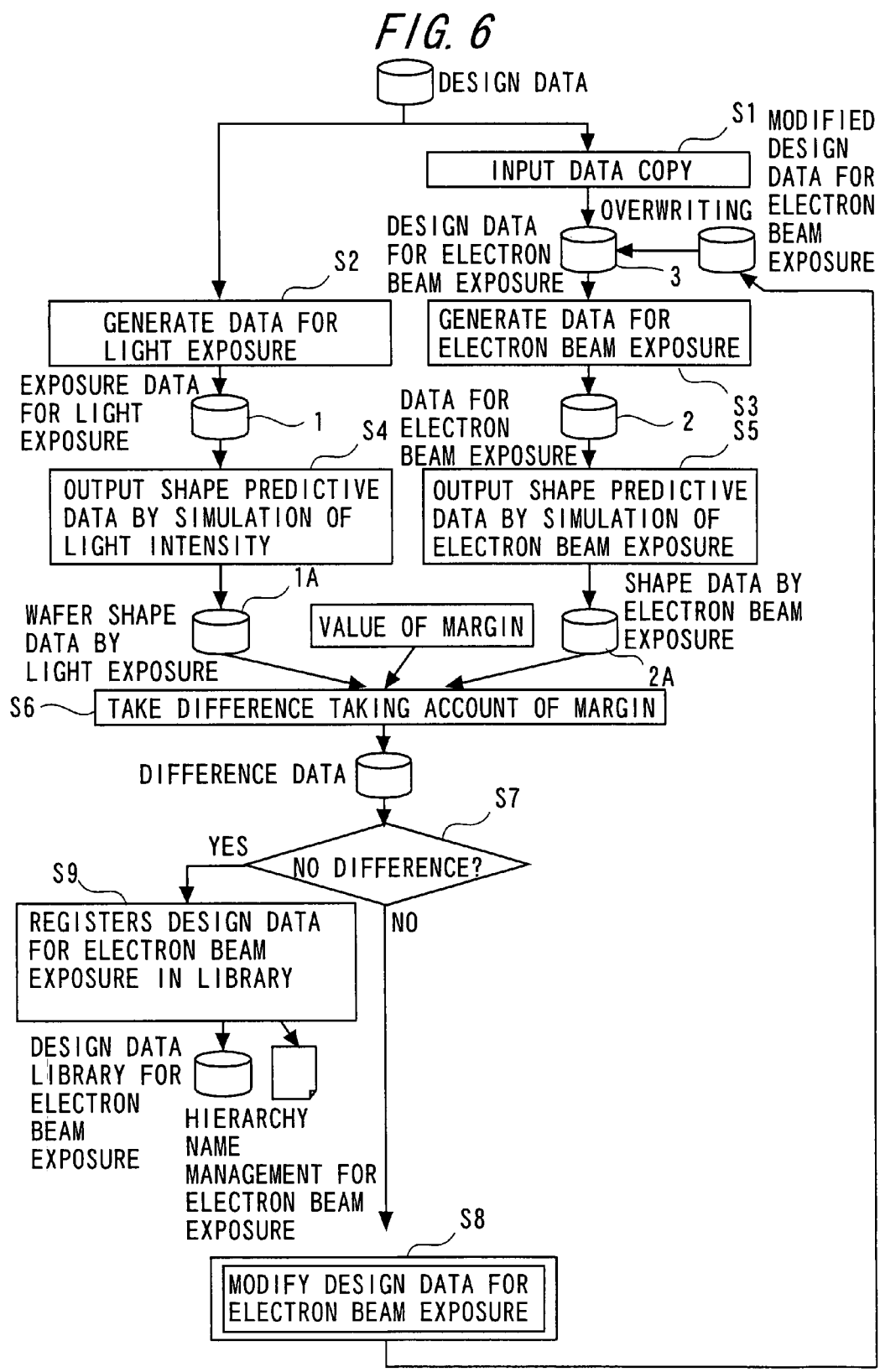

FIG. 9

| DIFFERENCE FLAG(+/−) |
|---|
| VERTEX COUNT (n) |

| | | |
|---|---|---|
| 1 | VERTEX X COORDINATE x1 | VERTEX Y COORDINATE y1 | NEIGHBORING FLAG(0/1) |
| 2 | VERTEX X COORDINATE x2 | VERTEX Y COORDINATE y2 | NEIGHBORING FLAG(0/1) |
| 3 | VERTEX X COORDINATE x3 | VERTEX Y COORDINATE y3 | NEIGHBORING FLAG(0/1) |
| 4 | VERTEX X COORDINATE x4 | VERTEX Y COORDINATE y4 | NEIGHBORING FLAG(0/1) |
| ⋮ | ⋮ | ⋮ | ⋮ |
| n−2 | VERTEX X COORDINATE x(n−2) | VERTEX Y COORDINATE y(n−2) | NEIGHBORING FLAG(0/1) |
| n−1 | VERTEX X COORDINATE x(n−1) | VERTEX Y COORDINATE y(n−1) | NEIGHBORING FLAG(0/1) |
| n | VERTEX X COORDINATE xn | VERTEX Y COORDINATE yn | NEIGHBORING FLAG(0/1) |

FIG. 12

| DIFFERENCE FLAG (+/−) | | |
|---|---|---|
| PATTERN COUNT (m) | | |

| | | |
|---|---|---|
| 1 | VERTEX X COORDINATE x11 | VERTEX Y COORDINATE y11 | NEIGHBORING FLAG (0/1) |
| 2 | VERTEX X COORDINATE x12 | VERTEX Y COORDINATE y12 | NEIGHBORING FLAG (0/1) |
| 3 | VERTEX X COORDINATE x13 | VERTEX Y COORDINATE y13 | NEIGHBORING FLAG (0/1) |
| 4 | VERTEX X COORDINATE x14 | VERTEX Y COORDINATE y14 | NEIGHBORING FLAG (0/1) |
| 5 | VERTEX X COORDINATE x21 | VERTEX Y COORDINATE y21 | NEIGHBORING FLAG (0/1) |
| ⋮ | 0 | 0 | ⋮ |
| 1*4 | ⋮ | ⋮ | −1* |
| m*4 | VERTEX X COORDINATE xm4 | VERTEX Y COORDINATE ym4 | NEIGHBORING FLAG (0/1) |

FIG.16

| ROW NUMBER | HIERARCHY NAME /WIRING INFORMATION | ADDRESS | DATA SIZE |
|---|---|---|---|
| 1 | EAAA | 25678 | 534 |
| 2 | EAABB | 3778 | 2691 |
| 3 | EABBCC | 11889 | 9466 |
| 4 | EBCCBCB | 23 | 127 |
| : | : | : | |
| : | #VIA1_LAYN01 | 578229 | 45 |
| : | #VIA2_LAYN01 | 872155 | 45 |
| : | : | : | |
| : | #METAL1_LAYN02 | 912547 | 287 |
| : | #METAL2_LAYN02 | 912547 | 287 |

SEMICONDUCTOR DEVICE MANUFACTURING METHOD, DATA GENERATING APPARATUS, DATA GENERATING METHOD AND RECORDING MEDIUM READABLE BY COMPUTER RECODED WITH DATA GENERATING PROGRAM

BACKGROUND OF THE INVENTION

The embodiment relates to a data generating technology for electron beam lithography.

A lithography process as one of LSI manufacturing processes generally involves using a light exposure in a mass production process of producing a large quantity of semiconductor devices. There is, however, a case of manufacturing a small quantity of semiconductor devices and semiconductor circuits before conducting the mass production based on the light exposure. A purpose thereof is to manufacture an engineering sample (ES) or to implement a macro test and a chip test on silicon. There is recognized effectiveness of utilizing an electron beam exposure for reducing a labor, a period of time and a cost for manufacturing reticles in order to manufacture a small quantity of products.

A reason thereof lies in an increase in the number of elemental devices included in one semiconductor device and a rise in degree of difficulty of manufacturing the reticle needed for exposing the semiconductor device due to an ultra deep-submicron process of the semiconductor device over the recent years. The rise in degree of the manufacturing difficulty becomes a load on manufacturing the reticle and brings about a cost-up and an increase in the manufacturing period. This type of reticle manufacturing load might suppress profits in business of the semiconductor devices or might become one of factors that affect a delivery period.

In manufacturing a large quantity of products, because of high productivity, it is valuable to employ a light exposure technology of performing an exposure by reticle pattern projection. On the other hand, this reticle load is not allowable to a small quantity of products. Therefore, for the small quantity of products, the load on manufacturing the reticle can be avoided by utilizing the electron beam exposure by which to implement the direct exposure over the semiconductor substrate with no intermediary of the reticle.

The technologies described above have such a problem that the finished shapes do not get coincident in the light exposure and in the electron beam exposure. It is an object of the present invention to generate such a piece of exposure data for the electron beam exposure that the shape based on the electron beam exposure gets coincident with or approximate to the finished shape when making the mass production, i.e., the shape processed based on the light exposure.

SUMMARY OF THE INVENTION

A semiconductor manufacturing method comprising, a data generating process including, acquiring a simulation light pattern that simulates a shape of a light exposure pattern formed on a substrate on the basis of design data of a semiconductor device, acquiring a simulation electron beam exposure pattern that simulates a shape of an electron beam exposure pattern formed by an electron beam exposure on the substrate on the basis of the design data, extracting difference information representing a shape difference portion between the simulation light pattern and the simulation electron beam exposure pattern, acquiring changed design data for modifying shape by changing the design data in accordance with the difference information, conducting the electron beam exposure on the substrate by use of the changed design data for modifying the shape.

BRIEF DESCRIPTION OF THE DRAWINGS

FIG. 5B is a diagram showing a exposure result using electron beam exposure data generated based on a pre-replacement rectangle data and a exposure result using electron beam exposure data generated based on post-replacement octagon data;

FIG. 6 is a flowchart explaining a process 1;

FIG. 9 is a diagram showing a data structure of a difference pattern storage table stored with a difference pattern;

FIG. 12 is a data example of an approximation difference pattern storage table stored with an approximation difference pattern;

FIG. 16 is a diagram showing a data example of an electron beam exposure hierarchy name/wiring information management table;

DETAILED DESCRIPTION OF THE INVENTION

Due to the use of the exposure technology different from when conducting the mass production, however, a different physical phenomenon occurs in the lithography process, with the result that a finished shape does not get coincident (see FIGS. 1A-1E and FIGS. 2A-2E). FIGS. 1A-1E each show a shape of a resist pattern formed on the semiconductor substrate after being exposed to the light. Further, FIGS. 2A-2E each illustrates a shape of the resist pattern formed on the semiconductor substrate after being exposed to the electron beams.

Namely, if the design data contains a rectangular shape or a rectangular portion like a wiring tip and if such a piece of design data is exposed to the electron beams, as illustrated in FIGS. 2A-2E, though a vertex portion is slightly rounded, the pattern takes a shape with the rectangular shape remaining.

On the other hand, in the case of manufacturing the reticle based on the same design data and making the light exposure by, e.g., a KrF excimer laser, as shown in FIGS. 1A-1E, a rectangular hole gets approximate to a circle, and the wiring tip portion takes a shape approximate to a semicircle.

Thus, even when the design data is the same, the patterns formed become largely different depending on the light exposure and the electron beam exposure. Hence, in a process subsequent to the lithography process, there is a necessity of changing a process condition and a parameter. Alternatively, such a problem arises that differences occur in a characteristic and a yield of the semiconductor device (see FIGS. 3 and 4).

Figure 1A:
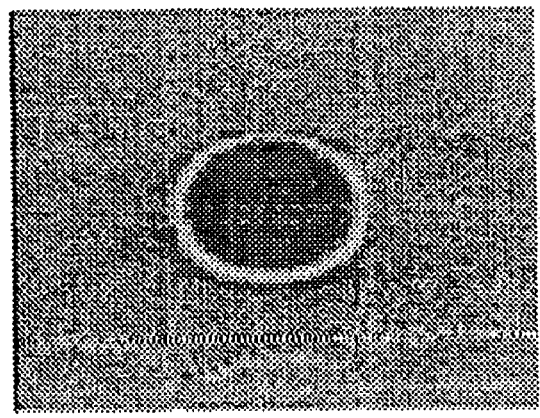
FIG. 1A is a resist shape in the case of being exposed to electron beams.
Figure 1B:
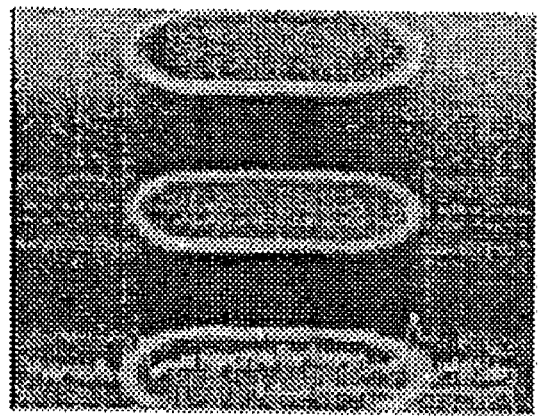
FIG. 1B is a resist shape in the case of being exposed to the electron beams.
Figure 1C:
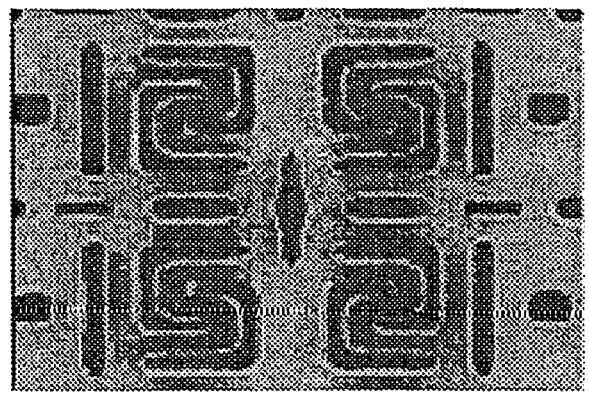
FIG. 1C is a resist shape in the case of being exposed to the electron beams.
Figure 1D:
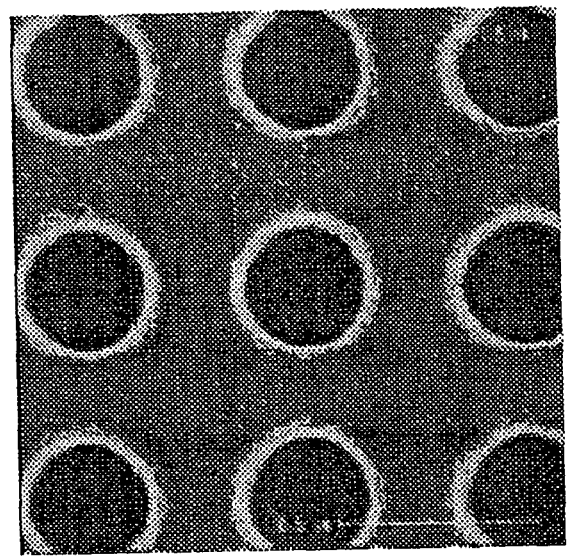
FIG. 1D is a resist shape in the case of being exposed to the electron beams.
Figure 1E:
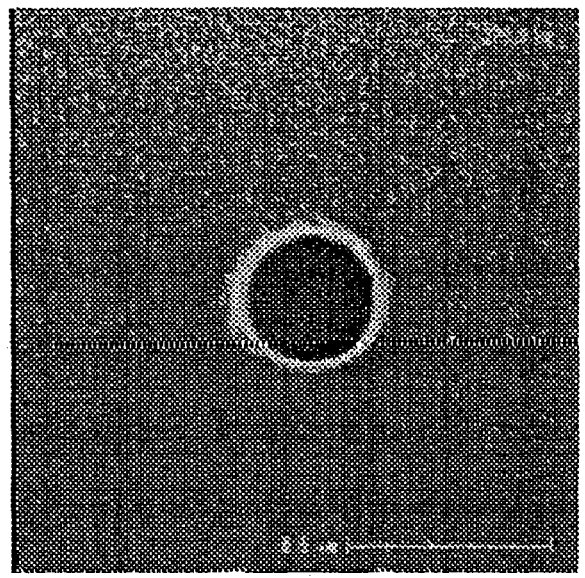
FIG. 1E is a resist shape in the case of being exposed to the electron beams.
Figure 2A:
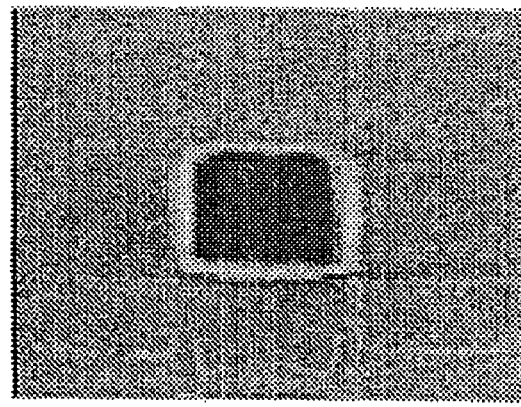
FIG. 2A is a resist shape in the case of being exposed to the light by a KrF excimer laser.
Figure 2B:
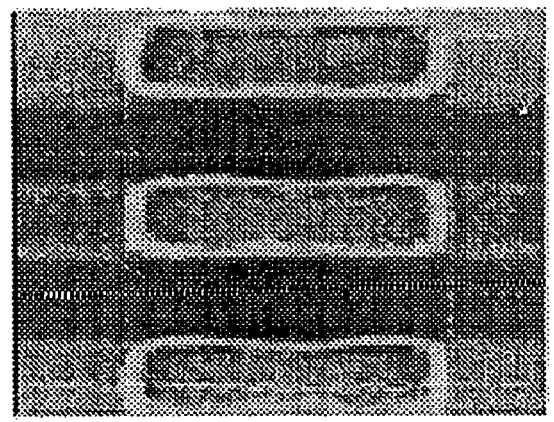
FIG. 2B is a resist shape in the case of being exposed to the light by the KrF excimer laser.
Figure 2C:
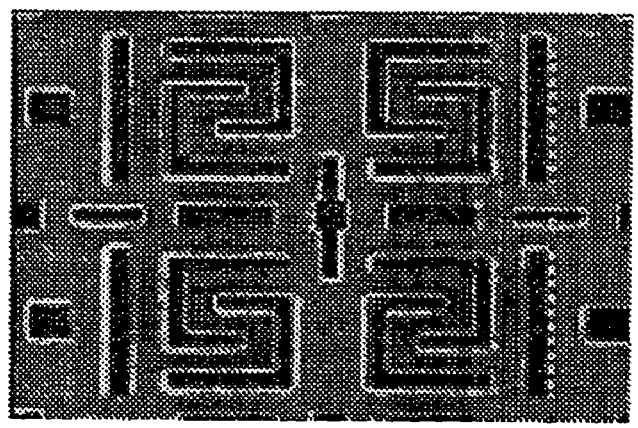
FIG. 2C is a resist shape in the case of being exposed to the light by the KrF excimer laser.
Figure 2D:
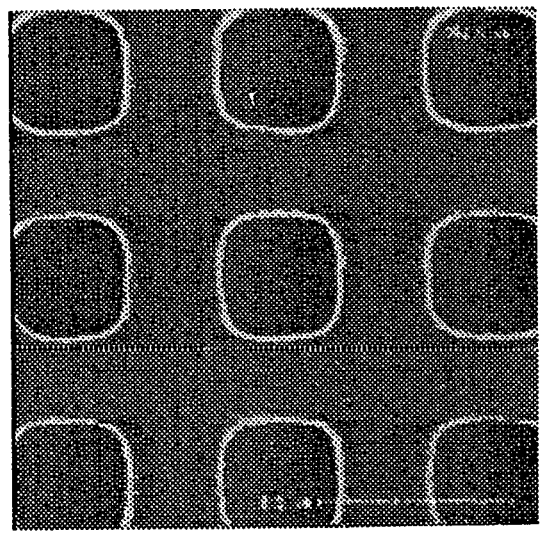
FIG. 2D is a resist shape in the case of being exposed to the light by the KrF excimer laser.
Figure 2E:
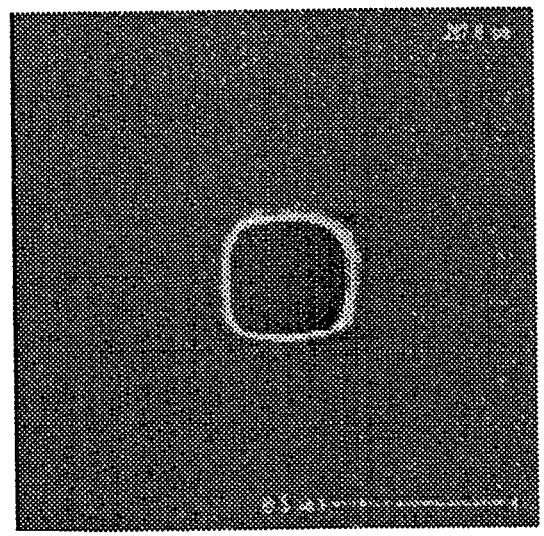
FIG. 2E is a resist shape in the case of being exposed to the light by the KrF excimer laser.
Figure 3:
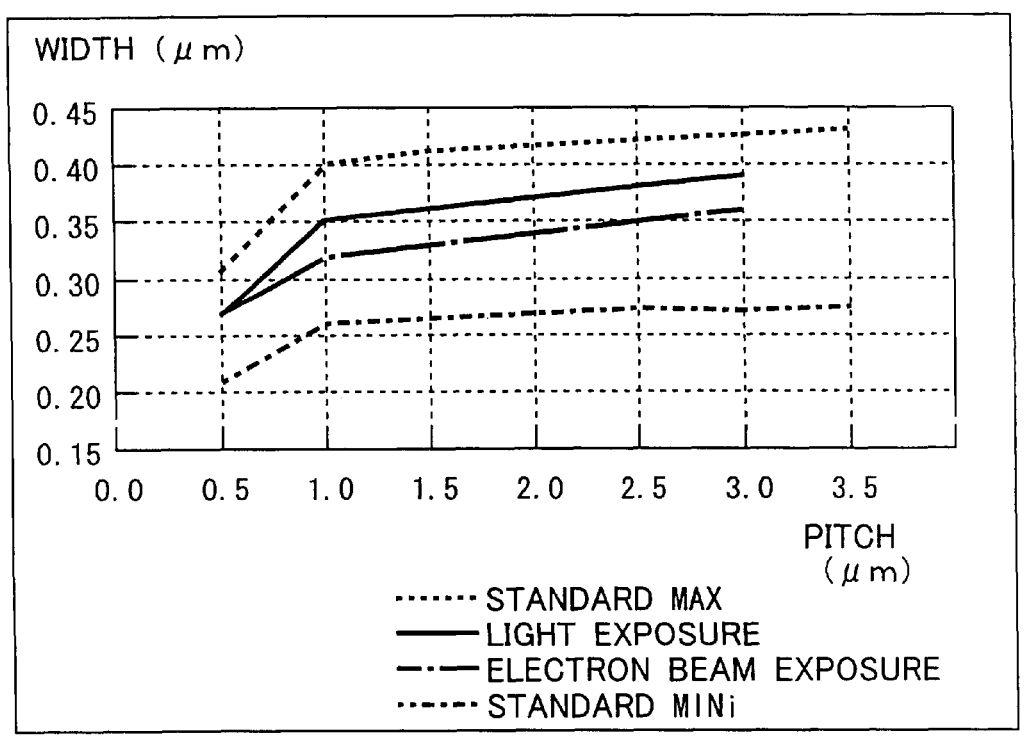
FIG. 3 is a diagram showing how a relationship between a line width and a wiring interval of a metal wiring pattern is measured and plotted.

For instance, FIG. 3 is a diagram showing how a relationship between a line width and a pitch (wiring interval) of a metal wiring pattern is measured and plotted (the unit is micron). In a range shown in FIG. 3, the line width of the metal wiring pattern falls within a range of a minimum value (standard min) of the standard and a range of a maximum value (standard max) of the standard. Pitch dependency of the line width apparently differs in the metal wiring based on the light exposure and in the metal wiring based on the electron beam exposure. Namely, as whole tendency, the light exposure tends to be thicker by approximately 0.04 microns.

Figure 4:
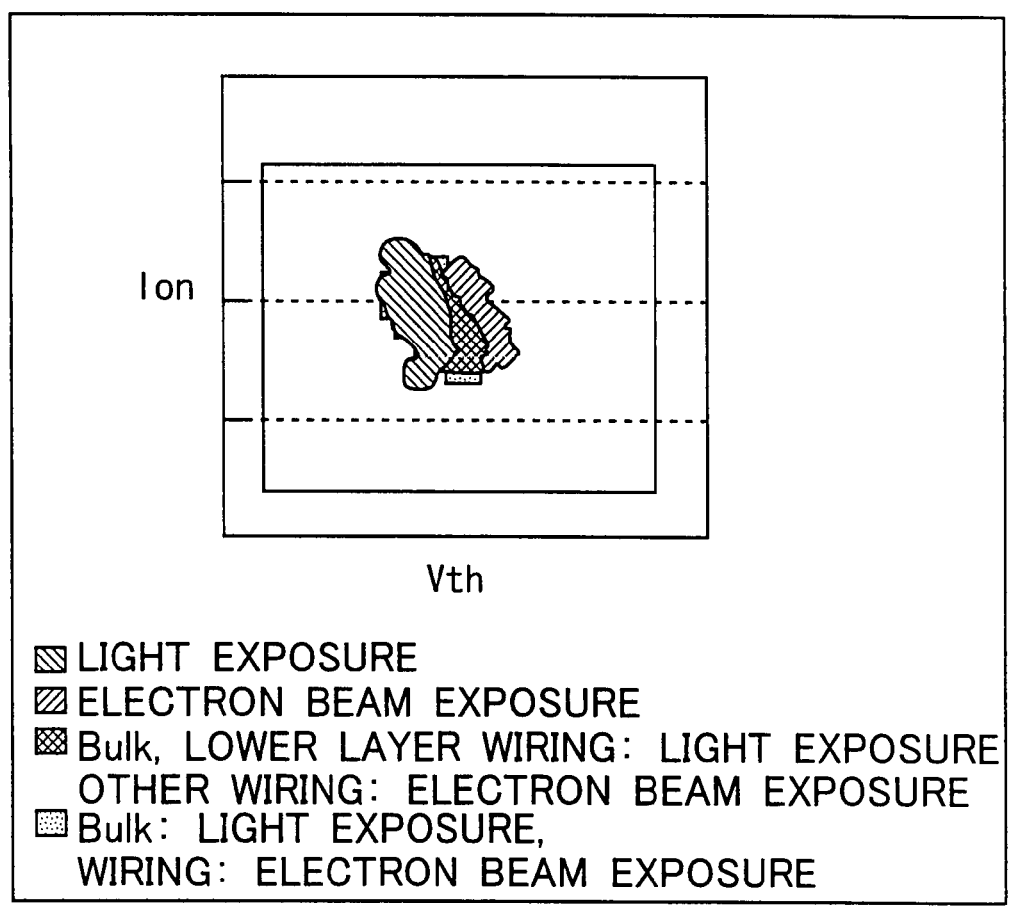
FIG. 4 is a diagram showing a relationship between a threshold voltage (Vth) and an ON-current (Ion) of a semiconductor device manufactured based on the light exposure and a semiconductor device manufactured based on the electron beam exposure.

Moreover, FIG. 4 is a diagram showing a relationship between a threshold voltage (Vth) and an ON-current (Ion) of the semiconductor device manufactured based on the light exposure and the semiconductor device manufactured based on the electron beam exposure. As shown in FIG. 4, in the case of making the light exposure over all of the exposure target layers, in the case of making the electron beam exposure over all of the exposure target layers, in the case of exposing a Bulk layer and a lower layer to the light and exposing other layers to the electron beams, and in the case of exposing the Bulk layer to the light and other layers including the wiring to the electron beams, deviations occur in characteristics from each other.

Thus, generally, the differences occur in the line width, the pattern shape and the element characteristic, depending on the pattern formed based on the light exposure and the pattern formed based on the electron beam exposure. Therefore, it follows that the deviation occurs also in an optimum condition of the process. Namely, it follows that the process condition of the manufacturing line using the electron beam exposure by which to make the direct exposure over the semiconductor substrate through none of the reticle for the small quantity of products, is not coincident with the process condition of the manufacturing line employing the light exposure for the mass production. Hence, eventually, it often happens that the semiconductor device is manufactured by manufacturing the reticle and using the light exposure also for the small quantity of products.

A data generating apparatus according to a best mode (which will hereinafter be referred to as an embodiment) for carrying out the present invention will hereinafter be described with reference to the drawings. A configuration in the following embodiment is an exemplification, and the present invention is not limited to the configuration in the embodiment.

In a case where each pattern, of which design data is converted into exposure data, undergoes an exposure on a semiconductor substrate by each lithography means, a light intensity simulation and an exposure intensity simulation by an electron beam exposure show what shape the pattern will take. Respective pieces of shape data obtained from the simulations are compared, then the design data is changed so as to modify a portion having a difference, and the changed data is newly registered as a design data library for the electron beam exposure. Note that the electron beam exposure is also called electron beam lithography.

Figure 5A:
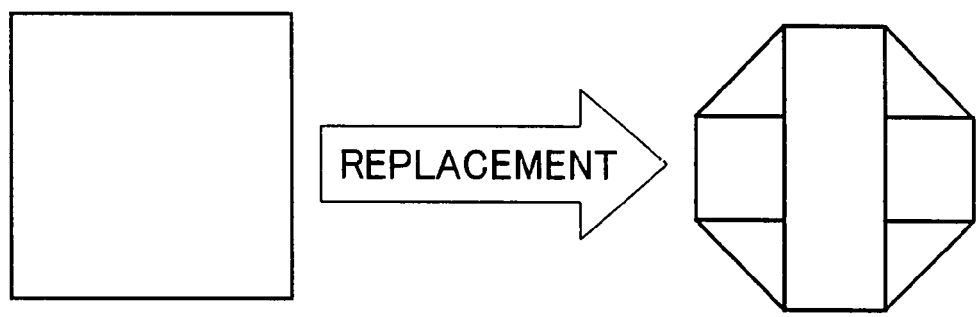
FIG. 5A is a diagram showing a pre-replacement pattern shape and a post-replacement pattern shape of a via-hole.

On the occasion of generating the exposure data for the electron beam exposure, at first the inputted original design data of pieces of cell data, hole shape data and wiring data is replaced with the corresponding piece of data within the design data library for the electron beam exposure. Then, the inputted original design data including the replaced corresponding piece of the data is subjected to an exposure data generating process. FIG. 5A illustrates pre- and post-replacing pattern shapes of via holes. As illustrated in FIG. 5A, the pre-replacing design data is data of a rectangle substantially approximate to a square. Further, the post-replacing design data takes an external shape in octagon of which the number of vertexes is "8".

FIG. 5B shows a exposure result by use of the electron beam exposure data generated based on the pre-replacing rectangle data, and also a exposure result by use of the electron beam exposure data generated based on the post-replacing octagon data. FIG. 5B illustrates a shape of a resist pattern into which a resist is developed on the semiconductor substrate.

As shown in FIG. 5B, the exposure result based on the post-replacing octagon data is approximate to the result of the light exposure shown in FIGS. 1A-1E. Thus, according to the embodiment, the shape equal to the case of using the light exposure can be obtained by use of the electron beam exposure. Accordingly, a semiconductor device exhibiting a characteristic equal to or similar to the case of the light exposure by combining this type of exposure process with other semiconductor device manufacturing processes such as etching, removing the resist, implanting the impurity, forming the gate, embedding the metal layer, forming the wiring, forming the inter-layer dielectric and forming the plug layer.

It is therefore possible to manufacture the semiconductor device or the semiconductor circuit having the characteristic approximate to the characteristic of the device manufactured based on the light exposure at a low cost and in a short delivery period without manufacturing the reticle for a small quantity of product. The embodiment is highly effective in the semiconductor device business.

A data generating apparatus according to a working example of the embodiment will hereinafter be described with reference to the drawings.

<Hardware Configuration>

The data generating apparatus is actualized in such a way that a data generating program is executed on a normal type of computer such as a personal computer and a server. Each of this type of computers has a CPU, a memory, an input/output interface, a display device, a hard disk, a communication interface with a network, a drive for a detachable portable storage medium, and so on. Components and operations of this type of computer are widely known, and hence their explanations are omitted.

The design data of the semiconductor device, which is processed by the data generating apparatus, may, however, be managed and stored on the same computer as of the data generating apparatus. Further, the data generating apparatus may configure a computer system by linking with other computers. For instance, there may exist other computers that generate and manage the design data of the semiconductor device. It may be sufficient that the data generating apparatus can access the design data of the semiconductor device that is managed by these other computers via, e.g., the network.

<Whole Processing Procedures>

The embodiment is carried out, by rough classification, in two types of processes (which will hereinafter be termed a process 1 and a process 2). In the process 1, the data generating apparatus creates the design data library for the electron beam exposure. Namely, the data generating apparatus changes a design cell library defined as component data and shapes of design via-hole patterns and of design wiring patterns, which are contained in the original design data.

Herein, the "change of shape" connotes changing the pattern shape so as to form, even in the case of conducting the electron beam exposure on the semiconductor substrate, the same pattern as the pattern formed on the semiconductor substrate in the case of undergoing the light exposure. In this case, the shape of the resist pattern in the case of being exposed to the light and developed, is obtained by simulation, and the shape of the resist pattern in the case of being exposed by the electron beams and developed, is obtained by simulation. Then, a difference therebetween is extracted from both of the resist patterns, and the shape of the pattern subjected to the electron beam exposure is changed so as to diminish the difference. Subsequently, the data generating apparatus registers these shape-changed patterns in the design data library for the electron beam exposure. Herein, the shape-changed patterns are called design data for the electron beam exposure, which is changed for modifying shape.

In the process 2, the data generating apparatus generates the data for the electron beam exposure from the design data. Unlike the conventional process, however, the process 2 in the present working example involves executing an exposure data generating process using the design data inputted to the data generating apparatus after selecting corresponding pieces of design data for the electron beam exposure from within the design data library for the electron beam exposure and replacing the inputted design data with the corresponding piece of the design data for the electron beam exposure.

<Variety of Correcting Processes>

In the process 1, the shape of the resist pattern is obtained by the light exposure simulation and by the electron beam exposure simulation. In this case, the reticle pattern used in the light exposure undergoes execution of a variety of corrections that are generally conducted at the present. These corrections are, to be specific, conducted for the electron beam exposure data for manufacturing the reticle. These corrections are exemplified such as generation of a dummy pattern for planarization, an optical proximity effect correction, a local flare correction and a microloading effect correction for taking account of influence by etching.

Further, the electron beam exposure data employed in the electron beam exposure simulation is subjected to execution of a variety of corrections that are generally carried out at the present. These corrections are exemplified such as the generation of the dummy pattern for planarization, the proximity effect correction, a stitching correction and the microloading effect correction for etching. Outlines of these corrections will hereinafter be explained.

It is to be noted that the following corrections are carried out according to a design rule matching with the technology node, i.e., according to a minimum line width, a minimum pattern interval and a pattern density that are specified for every technology node. Hence, the post-correction design data may be managed for every technology node.

(1) Generation of Dummy Pattern for Planarization

The generation of the dummy pattern for the planarization connotes a process of averaging a pattern area density with respect to at least any one of a gate layer and a metal layer (which is also called a wiring layer or also a metal wiring layer). Namely, this process is that a data area corresponding to the surface of the semiconductor substrate is segmented into small areas (segments) each having a predetermined size, a pattern area (planar dimension) in each segment of the inputted pattern is obtained, and an area density of the pattern in the segment is calculated. Then, a dummy pattern having a predefined layout is added to a portion having no influence of the dummy pattern in terms of device operation, of the segment that does not reach a reference area density in the respective segments so as to reach the reference area density.

(2) Optical Proximity Effect Correction (OPC)

The optical proximity effect correction (OPC) is a process of predicting an optical proximity effect (OPE) by the simulation based on physical models of the exposure and the development, then estimating a mask pattern correction quantity based on the predicted value, and moving sides of the pattern on the data for creating the reticle or changing the pattern shape. This type of correction on the data restrains a phenomenon that the pattern shape formed on the semiconductor substrate deviates from the design shape. This phenomenon occurs, for example, due to forming the pattern having a dimension that is approximately equal to or smaller than a wavelength of the light for exposure.

In the optical proximity effect correction, a rule-based OPC of correcting the design pattern based on a correction rule (OPC rule) acquired beforehand and a model-based OPC of correcting the design pattern by a phenomenon-modeled simulation in the lithography process, are separately utilized corresponding to a target layer.

As a means of the rule-based OPC, to begin with, a correction rule established by combining a variety of pattern processes is generated from testing etc. To be specific, this correction rule is a rule about a line width or about a change quantity with which to narrow or expand the line width based on a neighboring space dimension with respect to a pair of line patterns. The line correction is conducted based on this rule. A hammerhead correction of adding a rectangular pattern to a tip end of the line pattern is performed for preventing the tip end of the line pattern from being transferred (patterning) by projection. Moreover, a serif correction of adding a rectangle to a protruded corner portion of the square pattern is conducted in order to prevent the corner portion of the square pattern from being subjected to the patterning in a recessed state. Further, an inset correction of scraping off a recessed corner for preventing the recessed cornet of an L-shaped pattern from undergoing the patterning in a swollen state.

The model-based OPC is that a difference between the mask pattern and the transferred pattern by projection on the semiconductor substrate is calculated by simulation on the basis of the original design data, and the sides of the pattern data are moved to obtain a shape as the deign data specifies.

(3) Local Flare Correction

In the local flare correction, an aperture ratio of the design pattern is calculated for every fixed area of a shot. Then, a flare quantity of the mask pattern corresponding to the transfer pattern by projection is estimated with a point spread function using the double Gaussian function for every single shot area. Then, a mask dimension for obtaining a pattern having a predetermined dimension is acquired based on a shot layout to be transferred on the semiconductor substrate, and the sides of the pattern data are moved so as to become this mask dimension.

(4) Microloading Effect Correction

In the microloading effect correction, a phenomenon that an etching speed and an etching shape change corresponding to the pattern dimension, is obtained previously by testing. Then, a line width fluctuation quantity (X) is set in a table organized by a combination (2-tuple record) of a pattern dimension and a distance between neighboring patterns. The distance between the neighboring patterns is obtained with respect to each of the sides of the pattern inputted to the data generating apparatus, and the line width fluctuation quantity (X) is obtained from the table that is experimentally set beforehand. Then, in the microloading effect correction, a position of the side is moved by $-X/2$ with respect to the line width fluctuation quantity (X) in an outside (neighboring pattern side) direction. Herein, a meaning of "−" (minus sign) represents a movement in a direction opposite to the line width fluctuation quantity (X) by the microloading effect.

(5) Proximity Effect Correction

A proximity effect connotes a phenomenon that an exposure intensity distribution fluctuates corresponding to the pattern density, the pattern dimension and the pattern interval due to a scatter of the electron beams on the semiconductor substrate. The proximity effect correction involves setting an electron beam exposure quantity per pattern and correcting a fluctuation of an absorption energy of the resist due to this phenomenon. Namely, the exposure quantity per exposure pattern is calculated based on an exposure intensity distribution (EID) function that is previously obtained by testing. Then, a self alignment calculation is performed while changing the exposure intensity of each exposure pattern in order for each exposure pattern to eventually obtain the same absorption energy, and finally the exposure intensity of each pattern is acquired.

(6) Stitching Correction

The stitching correction involves extending, for a pattern formed of a shot before stage moving and a next shot after stage moving of the exposure apparatus, a pattern edge of the stitched portion, or generating an additional pattern with the exposure intensity decreased approximately by half in a position of covering the stitched portion. With this correction, even when the stage movement occurs between the shot and the shot, the stitched portion is smoothed.

<Process 1>

The process 1 will hereinafter be described with reference to FIG. 6. In the process 1, the design data library for the electron beam exposure is created by copying the design data of the semiconductor device (S1). The design data contains the cell library data, the wiring data of the wiring layer and the via-hole data. The design data for electron beam exposure is stored in a design data storage unit 3 for the electron beam exposure in the data generating apparatus.

The cell library data is an aggregation of the polygonal patterns that configure the device such as a transistor etc. The wiring data is also defined by the polygonal patterns in many data files. Further, the via-hole data represents a pattern defined by the rectangle. These items of data such as the cell library data, the wiring data and the via-hole data are each assigned identifying information called a hierarchy name or wiring information. The identifying information is also called a cell name.

The hierarchy name or the wiring information is uniquely defined within one data file that forms the design data. Accordingly, the pattern can be laid out by referring to the hierarchy name or the wiring information. Further, a new component can be also defined by referring to the hierarchy name or the wiring information. A layout pattern of the semiconductor device is formed by combining these components.

In the present working example, on the occasion of copying, it is possible to distinguish from the original data by prefixing the head of the hierarchy name with a letter "E", thus enabling the E-prefixed identifying information to be associated with the original data.

Next, the data generating apparatus executes two types of exposure data generating processes for an exposure target layer in the design data. One type of process is a process of generating the data for the light exposure by inputting the design data (S2). This process is, for example, the same process as the exposure data generating process for manufacturing the reticle. By this process, the exposure data for the light exposure is stored in an exposure data storage unit 1 for the light exposure in the data generating apparatus. The CPU of the data generating apparatus, which executes this process, corresponds to a light exposure data generating unit according to the embodiment.

The other type of process is a process of generating the electron beam exposure data by replacing part of the design data with the design data for the electron beam exposure except the first time (S3). By this process, the electron beam exposure data is stored in an electron beam exposure data storage unit 2 of the data generating apparatus. The CPU of the data generating apparatus, which executes this process, corresponds to an electron beam exposure data generating unit according to the embodiment.

In the processes in S2 and S3, the data generating apparatus generates the dummy pattern on the exposure layer that needs generating the dummy pattern for the planarization. Further, the data generating apparatus, in the exposure data generating process of manufacturing the reticle, executes the data process required for generating the exposure data for manufacturing the reticle such as the optical proximity effect correction, the local flare correction and the microloading effect correction for taking account of the influence by etching.

Moreover, the data generating apparatus, in the process of generating the electron beam exposure data, conducts the proximity effect correction, the stitching correction and the microloading effect correction for taking account of the influence by etching.

Next, the data generating apparatus, with respect to each piece of generated exposure data, converts a shape on the semiconductor substrate into pattern data by use of the exposure intensity simulations based on the light exposure and on the electron beam exposure, and thus outputs the pattern data (S4, S5). The CPU of the data generating apparatus, which executes the process in S4, corresponds to a light exposure simulation unit according to the embodiment. Further, the CPU of the data generating apparatus, which executes the process in S5, corresponds to an electron beam exposure simulation unit according to the embodiment.

As a result of the process in S4, wafer shape data 1A based on the light exposure is generated. The wafer shape data 1A based on the light exposure is data that simulates the shape based on the light exposure. In the light exposure, the reticle is created from the data for the light exposure, and, when the pattern on this reticle is transferred onto the semiconductor substrate by the light projection, the pattern is formed on a resist applied over the semiconductor substrate. A storage unit stored with this wafer shape data 1A based on the light exposure corresponds to a light pattern storage unit according to the embodiment. This storage unit is configured on, for instance, a hard disk.

Furthermore, as a result of the process in S5, wafer shape data 2A based on the electron beam exposure is generated. A storage unit stored with this wafer shape data 2A based on the electron beam exposure corresponds to an electron beam exposure pattern storage unit according to the embodiment. The wafer shape data 2A based on the electron beam exposure is data that simulates the shape based on the electron beam exposure. In the electron beam exposure, when the semiconductor substrate is irradiated with the electron beams in accordance with the data for the electron beam exposure, the pattern is formed on the resist applied over the semiconductor substrate. This storage unit is also configured on, for instance, the hard disk.

Herein, a light intensity simulator is employed for the data for light exposure. The data generating apparatus obtains Fourier integral with a focal length on a pupil plane and a complex amplitude transmittance distribution by use of a calculation model formula (Yeung's model) of an optical image based on a partial coherent imaging theory, and squares the obtained value, thereby acquiring the optical image on the semiconductor substrate. Further, the data generating apparatus calculates, based on an in-resist intensity distribution (Mack's model) taking account of reflections on a resist film and a base substrate, a light intensity distribution on the semiconductor substrate. Then, the data generating apparatus calculates an exposed-and-developed resist shape by drawing contours of the light intensity distribution. The processing itself by this type of light intensity simulator is well known, and hence details thereof are omitted. The resist applied over the semiconductor substrate corresponds to a pattern forming material according to the embodiment.

Further, the data generating apparatus calculates an absorption energy distribution by simulation in a way that employs the electron beam exposure simulator for the data for the electron beam exposure. Then, the data generating apparatus patterns the contours of the absorption energy intensity, and outputs the shape data on the semiconductor substrate. Herein, the data generating apparatus calculates a locus of incident electrons within a sample by the Monte Carlo method, a scattering angle of the electrons by the Screened Rutherford scattering formula and an energy loss by the Bethe's stopping power formula. Moreover, the data generating apparatus obtains, as a function of position, the absorption energy distribution per unit area in the resist. Then, the data generating apparatus calculates the finally exposed-and-developed resist shape by converting the absorption energy distribution into a solution speed distribution with respect to a developing solution. The electron beam exposure simulator itself is well known, and hence the details thereof are omitted.

Then, the data generating apparatus compares respective pieces of shape data with each other, thereby extracting a difference pattern (S6). A comparing method may be such that the shape data based on the light exposure and the shape data based on the electron beam exposure are subjected to a SUB operation in a pattern logic process. The CPU of the data generating apparatus, which executes the process in S6, corresponds to a difference extracting unit according to the embodiment.

It is noted, in the description given above, the same process as the exposure data generating process for manufacturing the reticle is executed in the process in S2. The process in S2 is not, however, limited to the exposure data generating process for manufacturing the reticle, and may be sufficient if being a process of converting the design data into an interface format enabling the data to be inputted to the light exposure simulator. Further, the process of generating the electron beam exposure data is executed as the process in S3. The process in S3 is not, however, limited to the electron beam exposure data generating process, and may be sufficient if being a process of converting the design data into an interface format enabling the data to be inputted to the electron beam exposure simulator.

Figure 7A:
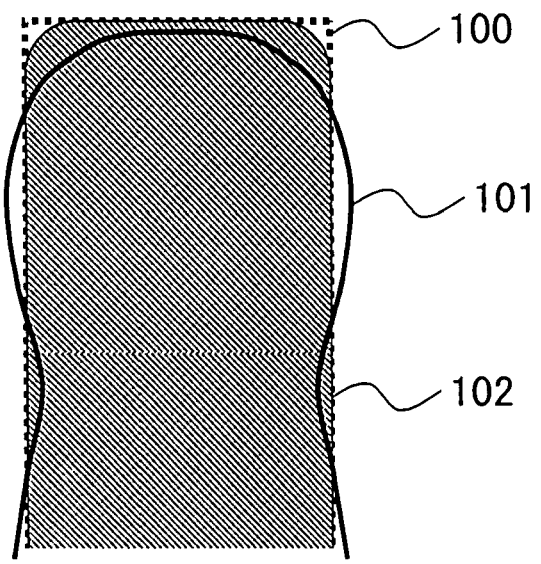
FIG. 7A is a data example of the resist shapes obtained by a light exposure simulator and by an electron beam exposure simulator.

FIG. 7A shows a data example of the resist shapes obtained from the light exposure simulation and from the electron beam exposure simulator, respectively. A pattern 100 depicted by a dotted line represents a pattern having the same dimension and the same shape as those of the design data for comparison. Further, a pattern 101 drawn by a solid line illustrates a resist shape on the semiconductor substrate that is calculated by the light intensity simulator. Moreover, a pattern 102 depicted by hatching of oblique lines shows a resist shape on the semiconductor substrate, which is calculated by the electron beam exposure simulator.

The data generating apparatus classifies the obtained difference data into a following plus (+) difference pattern and a minus (−) difference pattern that are given as below. To be specific, the shape pattern based on the light exposure on the outer side from the shape pattern based on the electron beam exposure is referred to as the plus (+) difference pattern. The plus (+) difference pattern may be subjected to the SUB operation in a way that subtracts the shape data based on the electron beam exposure from the shape data based on the light exposure in the pattern logic process. The CPU of the data generating apparatus, which executes this process, corresponds to a light increment generating unit according to the embodiment.

Figure 7B:
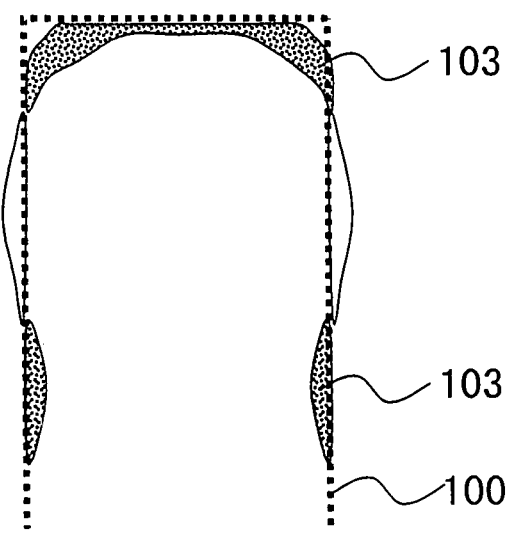
FIG. 7B is an example of a minus (−) difference pattern.
Figure 7C:
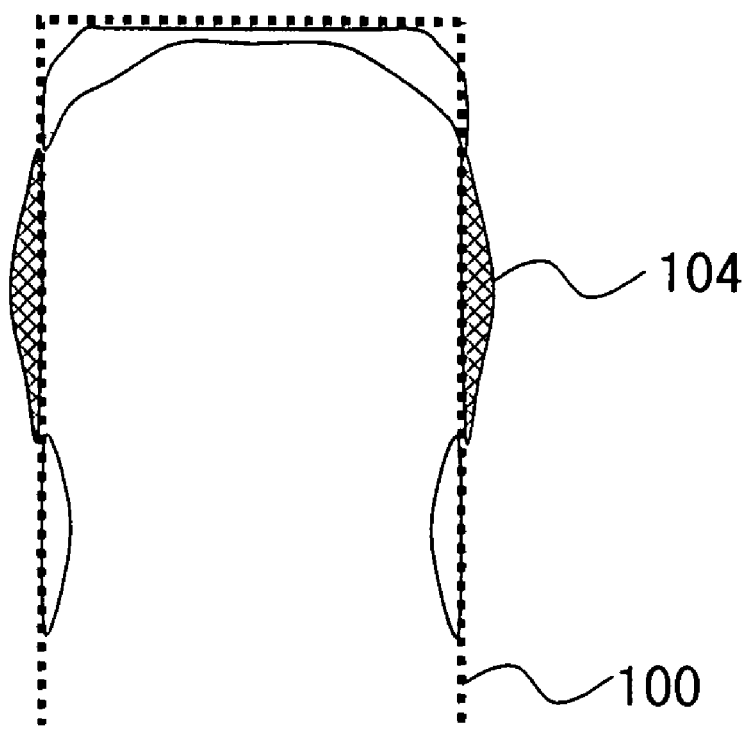
FIG. 7C is an example of a plus (+) difference pattern.

A pattern 104 in FIG. 7C shows a shape obtaining by performing the SUB operation of subtracting the pattern 102 based on the electron beam exposure from the pattern 101 based on the light exposure. FIG. 7C shows an example of the plus (+) difference pattern. The data generating apparatus, with respect to the plus (+) difference pattern, sets a flag for distinguishing a neighboring side abutting on the pattern 102 based on the electron beam exposure in the pattern contour, and thus stores the difference data.

Namely, the data generating apparatus, on the occasion of executing the SUB operation of subtracting the pattern 102 based on the electron beam exposure from the pattern 101 based on the light exposure, sets the flag on the neighboring side, abutting on the pattern 102 based on the electron beam exposure, of the remaining pattern. The CPU of the data generating apparatus, which executes this process, corresponds to a first setting unit according to the embodiment. Herein, the neighboring side abutting on the pattern 102 based on the electron beam exposure represents a side neighboring to the design data 100 as connoted (viewed) in FIG. 7C.

Accordingly, the flag is set to make distinguishable the side on which the plus (+) difference pattern is neighboring to the pattern of the shape change target data, i.e., the design data for the electron beam exposure that is copied from the (original) design data. This flag is termed a neighboring flag.

Moreover, the shape pattern based on the electron beam exposure on the outer side from the shape pattern based on the light exposure is referred to as the minus (−) difference pattern. The minus (−) difference pattern may be subjected to the SUB operation in a way that subtracts the shape data based on the light exposure from the shape data based on the electron beam exposure in the pattern logic process. The CPU of the data generating apparatus, which executes this process, corresponds to an electron beam increment generating unit according to the embodiment.

The pattern 103 in FIG. 7B shows a shape undergoing the SUB operation of subtracting the pattern 101 based on the light exposure from the pattern 102 based on the electron beam exposure. FIG. 7B shows an example of the minus (−) difference pattern. The data generating apparatus, with respect to the minus (−) difference pattern, distinguishes a neighboring side to the shape pattern based on the light exposure in the pattern contour, then sets a flag on the non-neighboring side, and thus stores the difference data.

Namely, the data generating apparatus, on the occasion of executing the SUB operation of subtracting the pattern 101 based on the light exposure from the pattern 102 based on the electron beam exposure, sets a flag, as a side that is not neighboring, to the sides other than the side abutting on the pattern 101 based on the light exposure, of the remaining pattern. The CPU of the data generating apparatus, which executes this process, corresponds to a second setting unit according to the embodiment.

Herein, the side that is not neighboring to the shape pattern based on the light exposure in the contour of the minus (−) difference pattern represents a side neighboring to the design data 100 as viewed in FIG. 7B. Accordingly, the flag is set to make distinguishable the side on which the minus (−) difference pattern is neighboring to the pattern of the shape change target data, i.e., the design data for the electron beam exposure that is copied from the (original) design data. This flag is also called the neighboring flag.

Figure 8:
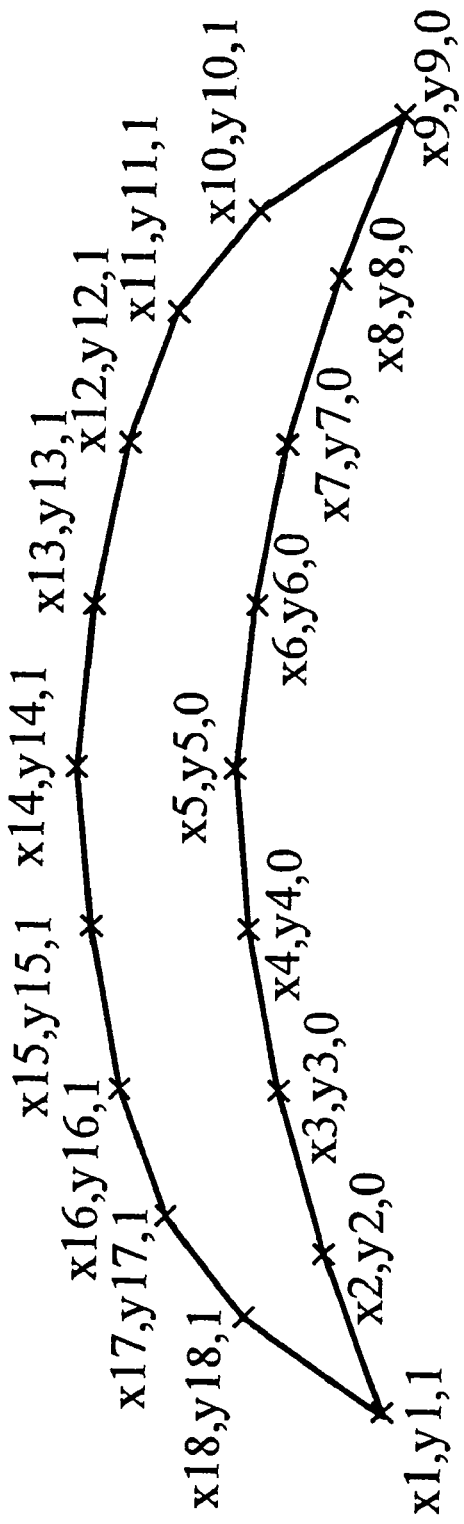
FIG. 8 is an example of a difference pattern.

FIG. 8 shows an example of the thus-generated difference pattern. The difference pattern is polygonal data defined by a string of vertexes.

FIG. 9 shows a data structure of a difference pattern storage table for storing the difference pattern. The difference pattern storage table has difference pattern management information and a table body. The difference pattern management information contains a difference flag and a vertex count. The difference flag is information that shows which pattern, the plus (+) difference pattern or the minus (−) difference pattern. The vertex count is the number of vertexes of a polygon that forms the difference pattern. Further, the table body contains element information (X, Y, A) organized by combining a vertex coordinate and a neighboring flag.

Next, the data generating apparatus judges whether or not the difference exceeds an allowable value (S7). Namely, the data generating apparatus retains the allowable value (a value of margin) showing whether it is judged to be the difference or not, and, if the difference exceeds the allowable value, judges that there is the difference. A value showing a range in which a shape difference of the resist pattern converges at a process scatter and a value showing a range that does not affect a characteristic difference, are given as the allowable values by external designation. It may be enough that an empirical value obtained by the actual semiconductor process or an experimental value can be set as such an allowable value.

As a result of the comparison, if no difference is recognized (YES in S7), the data generating apparatus registers a design data library file for the electron beam exposure in the design data library for the electron beam exposure, and creates an electron beam exposure hierarchy name/wiring information management table (see FIG. 16) by extracting the hierarchy name from within the design data for the electron beam exposure (S9). In this case, it follows that the difference data is not used. The CPU of the data generating apparatus, which executes the judgment in S7, corresponds to a restraining unit according to the embodiment. Further, the design data library for the electron beam exposure corresponds to a library storage unit for the electron beam exposure according to the embodiment.

As described above, the design data library for the electron beam exposure is managed in the same way on the condition that the design data library is, for example, corrected and managed per technology node and per performance characteristic of the device. Namely, the design data library for the electron beam exposure may be prepared individually per technology node and per performance characteristic of the device.

Moreover, the design data library for the electron beam exposure corrects the wiring and the via-hole with a dimension and a pattern density corresponding to the technology node, and individually retains the corrected data. In this case, with respect to a circuit portion corresponding to the thickest line width and the narrowest wiring interval that are determined by at least the technology node thereof, the difference information is extracted, and the shape of the design data may also be changed. This is because the circuit portion corresponding to the thickest line width and the narrowest wiring interval is a circuit portion in which a difference between the light exposure and the electron beam exposure becomes large. The data of this type of circuit portion may be structured by allocating the thickest line width determined by the technology node thereof at the narrowest wiring interval determined by the technology node thereof. Further, the difference pattern may also be obtained by specifying the data with the hierarchy name containing such a circuit portion.

Note that the electron beam exposure hierarchy name/wiring information management table is managed, in the same way as in the case of the design data library for the electron beam exposure, by categories corresponding to the technology node and to the performance characteristic of the device. The table corresponding to each technology node and each performance characteristic of the device, is stored with a hierarchy name, a head address in the design data for the electron beam exposure in the hierarchy data thereof, and a data size (byte count). The hierarchy names are sorted in the alphabetic order.

If the difference is recognized (NO in S7), the data generating apparatus modifies the design data for the electron beam exposure in accordance with the difference data (S8). The CPU of the data generating apparatus, which executes the process in S8, corresponds to a data modifying unit according to the embodiment.

Moreover, the data generating apparatus updates the design data library file for the electron beam exposure with a modified file, and again generates the data for the electron beam exposure by use of this (updated) data. Then, the data generating apparatus repeats the processes in S3 and S5 through S8 till the difference disappears. The CPU of the data generating apparatus, which executes this process, corresponds to a control unit according to the embodiment.

Figure 10:
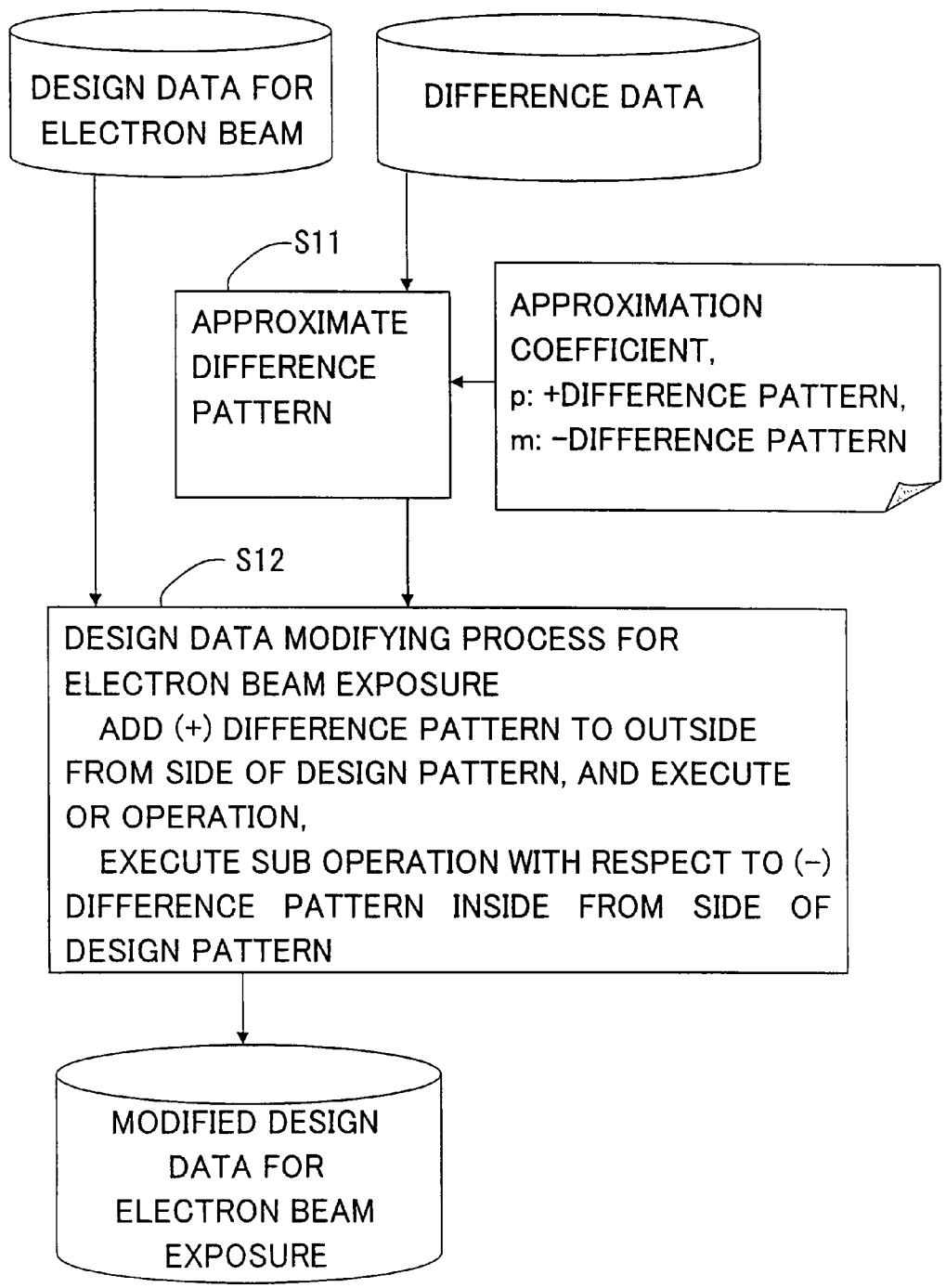
FIG. 10 is a diagram showing a method of modifying design data for the electron beam exposure.

FIG. 10 shows a method (a detailed procedure in S8 in FIG. 6) of modifying the design data for the electron beam exposure. In this process, the data generating apparatus, at first, inputs the difference data and approximates the difference pattern to a pattern such as a rectangle and a triangle suited to the electron beam exposure (S11). On this occasion, a coefficient of approximation is employed. The coefficient of approximation takes a value larger than "0" but equal to or smaller than "1" and is inputted externally in a way that provides two types of coefficient of approximations such as a (+) difference coefficient and a (−) difference coefficient. Tow or more types of coefficients of approximation may also, however, be inputted externally. Further, the coefficient of approximation may also be inputted externally by commonizing the (+) difference coefficient and the (−) difference coefficient.

The coefficient of approximation is a parameter designating, to the data generating apparatus, how much fine the difference data is approximated with the rectangle or the triangle. For instance, in the case of approximating multi-vertex data to one edge, this parameter is a parameter that shows what rate the vertex count is decreases at. In place of the parameter showing such a rate, however, a predetermined distance is designated, and the vertexes on a polygonal line fluctuating within this distance may also be approximated to one edge. Further, a vertex count is designated, and a polygonal line having this vertex count may also be set as one edge. The CPU of the data generating apparatus, which executes the process in S11, corresponds to an approximation unit according to the embodiment.

Furthermore, in the process in S11, the data generating apparatus takes over the information of the neighboring flag as it is, and sets the neighboring flag at a corresponding vertex of a post-approximation difference pattern.

Figure 11:
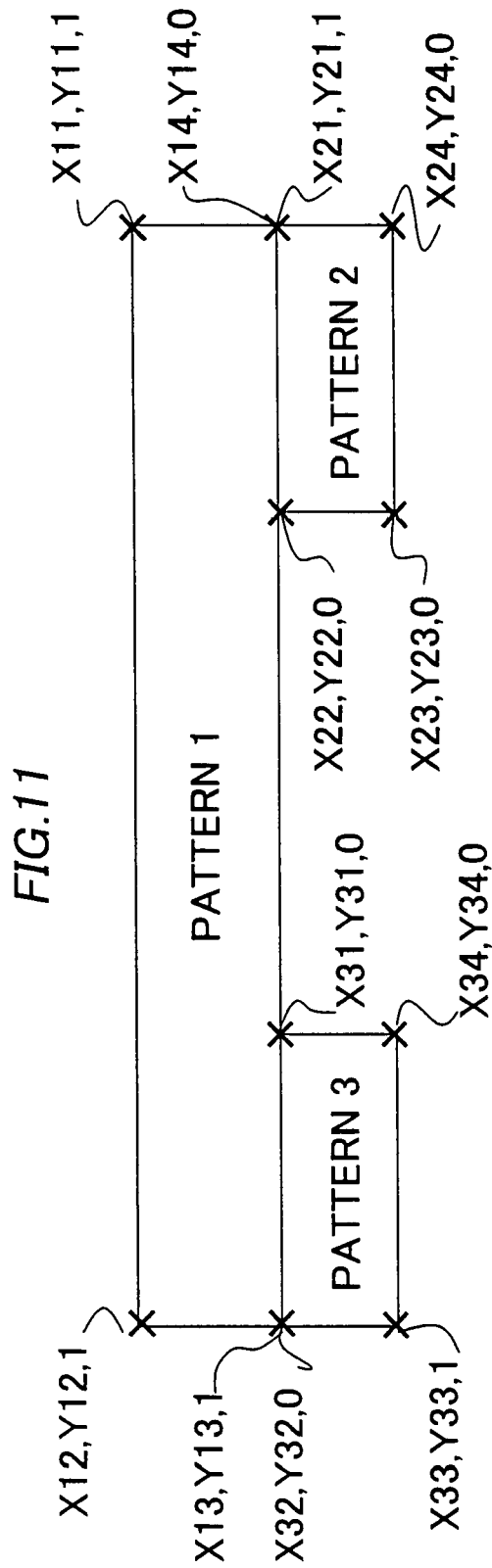
FIG. 11 is an example of an approximation difference pattern into which the difference pattern is approximated with a rectangle.

FIG. 11 shows an example of an approximation difference pattern obtained by approximating the difference pattern in FIG. 8 with the rectangle. In FIG. 11, the approximation difference pattern is formed of three rectangles such as a pattern 1, a pattern 2 and a pattern 3.

FIG. 12 shows a data example of an approximation difference pattern storage table stored with the approximation difference pattern. The approximation difference pattern storage table includes approximation difference pattern management information and a table body.

The approximation difference pattern management information contains a difference flag and a pattern count. The difference flag is the same as the difference pattern management information and is a flag for distinguishing between the plus (+) difference pattern and the minus (−) difference pattern. Further, the pattern count is the number of rectangles stored in the table body.

The table body contains the rectangles corresponding to the pattern count in the difference pattern management information. The rectangle is formed by four vertexes. Each vertex is defined by coordinates thereof and the neighboring flag such as (vertex X, vertex Y, neighboring flag). Hence, one rectangle has a 4-tuple element (vertex X, vertex Y, neighboring flag). The table body is stored with the 4-tuple element repeated by the pattern count.

Note that the difference pattern may be approximated with the triangle, e.g., a right-angled triangle instead of approximating the difference pattern with the rectangle. Further, the difference pattern may also be approximated with a combination of the rectangle and the triangle. For example, the right-angled triangles may be set in place of the rectangles respectively at both of edges (vicinal to coordinates x1, y1 and vicinal to coordinates x9, y9) of the difference pattern illustrated in FIG. 8. Namely, in place of the single rectangle, the edge portion of the difference pattern may be approximated with the triangle formed by cutting off the rectangle by a diagonal line.

In the present working example, even in the case of storing such a triangle in the table body of the approximation difference pattern storage table, in the same way as in the case of storing the rectangle, the table body is occupied by every four vertexes. In this case, the neighboring flag at the fourth vertex is set to a value other than "neighboring/non-neighboring" (values), and it may be sufficient to explicitly show "unused". For example, the example in FIG. 12 is that the neighboring flag is set such as "neighboring"=1, "non-neighboring"=0, and "unused"=−1.

Next, the data generating apparatus applies modification to the design data for the electron beam exposure by use of the post-approximation difference pattern (S12). A neighboring side of the difference pattern is disposed at the corresponding side of the corresponding design pattern. Then, the data generating apparatus performs an OR operation in the pattern logic process between the plus (+) difference pattern and the design data for the electron beam exposure. Further, the data generating apparatus conducts the SUB operation in the pattern logic process between the design data for the electron beam exposure and the minus (−) difference pattern. As a result of these operations, the design data for the electron beam exposure, which has thus been modified, is stored as the already-modified design data for the electron beam exposure. The CPU of the data generating apparatus, which executes this process in S12, corresponds to an arithmetic unit according to the embodiment.

Figure 13A:
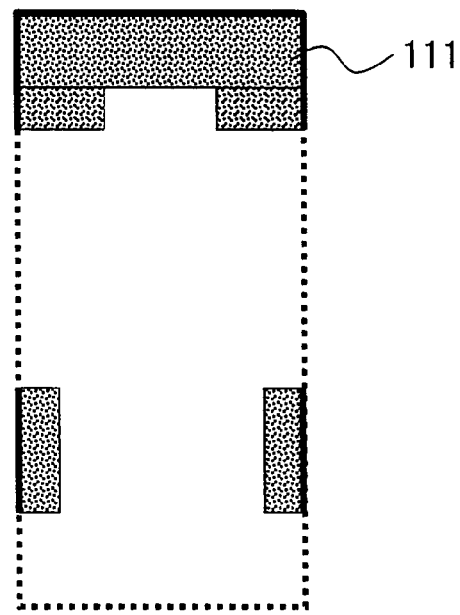
FIG. 13A is an example of a minus (−) approximation difference pattern.
Figure 13B:
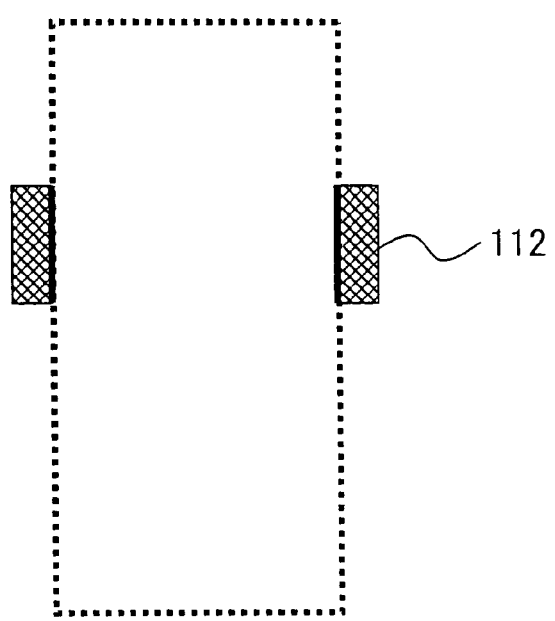
FIG. 13B is an example of a plus (+) approximation difference pattern.
Figure 13C:
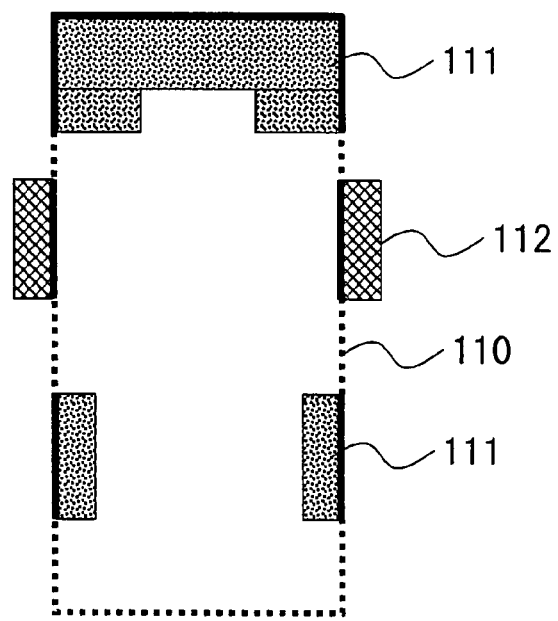
FIG. 13C is a diagram showing the minus (−) difference pattern and the plus (+) difference pattern together with the pre-modifying design data for the electron beam exposure superinposed.
Figure 13D:
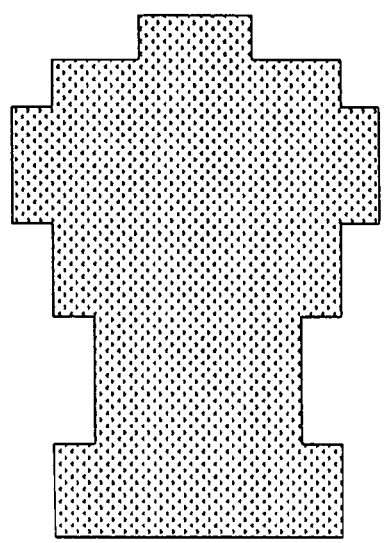
FIG. 13D is an example of a result of performing a SUB operation of subtracting the minus (−) difference pattern from the pre-modifying design data for the electron beam exposure and an OR operation about the plus (+) difference pattern.

FIG. 13A shows an example of a minus (−) approximation difference pattern 111 into which to approximate the minus (−) difference pattern in FIG. 7B. Further, FIG. 13B shows an example of a plus (+) approximation difference pattern 112 into which to approximate the plus (+) difference pattern in FIG. 7C. FIG. 13C illustrates a state where the minus (−) approximation difference pattern 111 and the plus (+) approximation difference pattern 112 are superposed on the pre-correction design data 110 for the electron beam exposure. The pre-correction design data is stored in a design data storage unit 3 for the electron beam exposure in the data generating apparatus. The pre-correction design data hereinafter is the same meaning. Moreover, FIG. 13D shows an example of results of performing the SUB operation of subtracting the minus (−) approximation difference pattern 111 from the pre-correction design data 110 for the electron beam exposure, and of performing the OR operation with respect to the plus (+) approximation difference pattern 112.

The data generating apparatus similarly, with respect to the via-hole pattern of the wiring layer and the metal layer pattern, obtains the difference, makes the modification, and stores a result of the modification as an already-modified design data library file for the electron beam exposure. Moreover, the data generating apparatus registers the already-modified data in the design data library for the electron beam exposure, and stores the wiring data information (e.g., changes in data size, head address, etc) in the electron beam exposure hierarchy name/wiring information management table.

By the processes described above, with respect to the cell library, the wiring data and the via-hole, it is possible to acquire the design data library for the electron beam exposure as the modified design data for obtaining the same shape as the shape undergoing the light exposure even in the case of conducting the electron beam exposure.

Note that in FIG. 13A, the neighboring side of the minus (−) approximation difference pattern 111 is coincident with the side of the pattern in the design data for the electron beam exposure. In FIG. 13B, the neighboring side of the plus (+) approximation difference pattern 112 is coincident with the side of the pattern in the design data for the electron beam exposure. Generally, however, it is rare that any one of the sides of the difference patterns between the resist shape obtained by the light exposure simulation and the resist shape obtained by the electron beam exposure simulation is coincident with any one of the sides of the patterns in the design data for the electron beam exposure.

Such being the case, the data generating apparatus, before executing the OR operation and the SUB operation of the patterns, executes a process of locating the neighboring vertex of the approximation difference pattern at a modifying target side of the design data (the pre-correction design data for the electron beam exposure) before executing the operations. More specifically, the data generating apparatus sets, as a neighboring side, a side interposed between two neighboring vertexes of the approximation difference pattern. Then, external sides forming an external shape of the pre-correction design data for the electron beam exposure within a predetermined distance from the neighboring side, are searched for. Subsequently, the approximation difference pattern is moved to positions of the searched external shape sides of the pre-correction design data for the electron beam exposure so as to superpose the neighboring side of the approximation difference pattern thereon.

The movement in this case is done in parallel as it is without rotating the approximation difference pattern. A reason why so is that the difference pattern due to the difference between the light exposure and the electron beam exposure is a pattern with its pattern width increasing and decreasing in a direction orthogonal to a longitudinal direction of, e.g., the rectangle (see FIGS. 13A-13C). Accordingly, the shape change based on the approximation difference pattern is a shape change that thickens or thins the line width of the wiring pattern. Moreover, this shape change is a shape change that increases or decreases a width or a height of the rectangle. Hence, the approximation difference pattern has the neighboring side parallel with the wiring or the side of the rectangle in many cases. Such being the case, the neighboring side of the approximation difference pattern is located at the external shape side of the pre-correction design data for the electron beam exposure, thereby making it possible to locate at the external shape side of the pre-correction design data for the electron beam exposure that should originally be changed in shape.

In this case, a closest external shape side in the external shape sides existing in the vicinity of the neighboring side, e.g., within the predetermined distance, may be searched for as the external shape side at which to locate the neighboring side of the approximation difference pattern. For example, however, in the case of the plus (+) approximation difference pattern 112 shown in FIG. 13C, the external shape side may be searched for so as to satisfy a condition that the plus (+) approximation difference pattern 112 is disposed on the outside of the external shape side of the pre-correction design data for the electron beam exposure. Namely, it follows that plus (+) approximation difference pattern 112 gets circumscribed from the outside of the pre-correction pattern.

Further, in the case of the minus (−) approximation difference pattern 111, the external shape side may be searched for so as to meet a condition that the minus (−) approximation difference pattern 111 is disposed on the inside of the external shape side of the pre-correction design data for the electron beam exposure. Namely, it follows that the minus (−) approximation difference pattern 111 gets inscribed from the inside of the pre-correction pattern. The CPU of the data generating apparatus, which executes the process of locating the neighboring side, corresponds to a position correcting unit according to the embodiment. Moreover, the external shape side of the pre-correction design data for the electron beam exposure in the vicinity of the neighboring side, at which the neighboring side is located, corresponds to a modification-undergone side according to the embodiment.

<Process 2>

Figure 14:
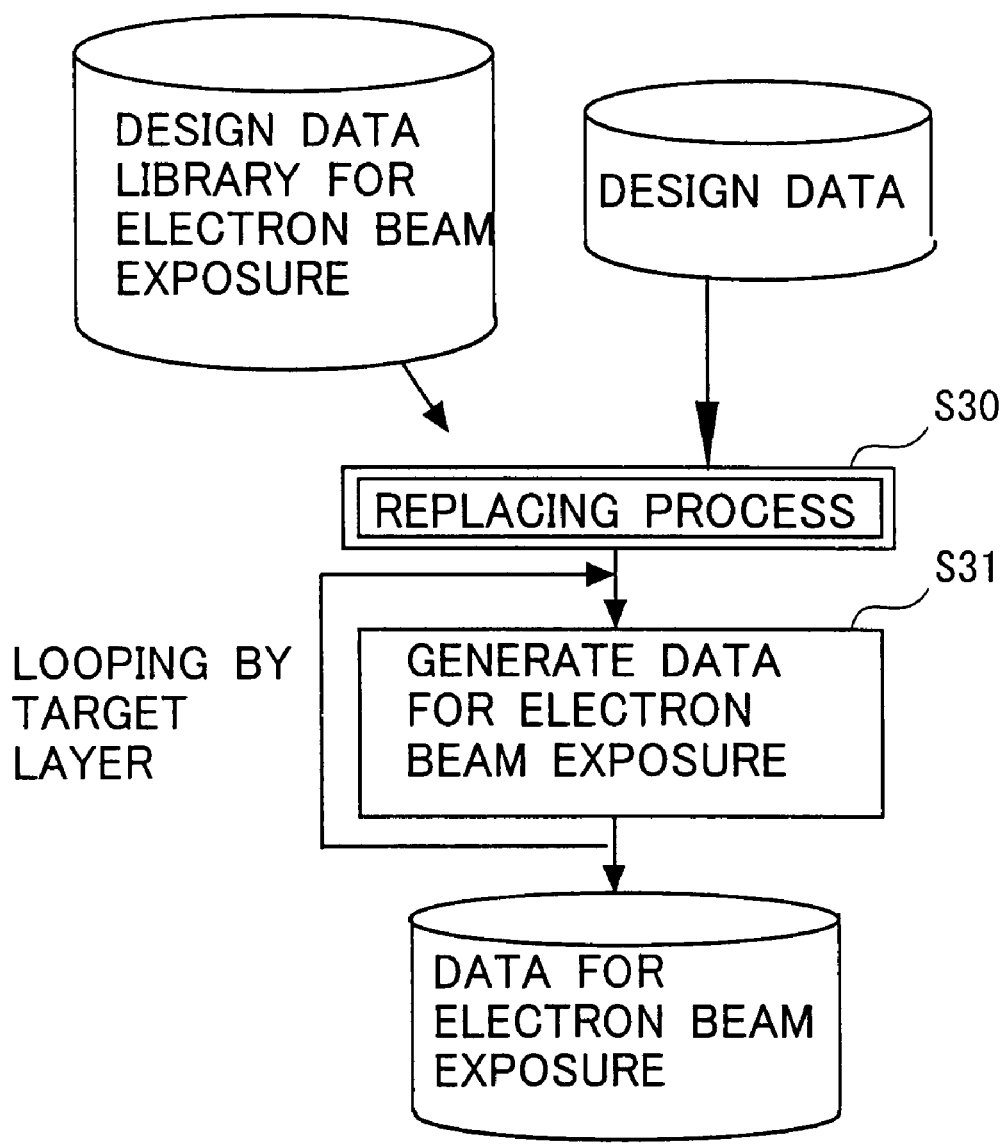
FIG. 14 is a diagram showing a processing outline of a process 2.

FIG. 14 shows a processing outline of the process 2. In this process, the data generating apparatus generates the data for the electron beam exposure that serves to actually print the design data of a product on the semiconductor substrate. In this process 2, the data generating apparatus, at first, selects the corresponding design data for the electron beam exposure from within the design data library for the electron beam exposure, and replaces the design data with this corresponding design data selected (S30). The CPU of the data generating apparatus, which executes the process in S30, corresponds to a replacing unit according to the embodiment.

Next, the data generating apparatus executes the exposure data generating process with respect to the target layer that is exposed to the electron beams by use of the design data which has undergone the replacing process (S31). The process in S31 is repeated for all of the exposure target layers. The CPU of the data generating apparatus, which executes the process in S30, corresponds to a converting unit according to the embodiment.

Figure 15:
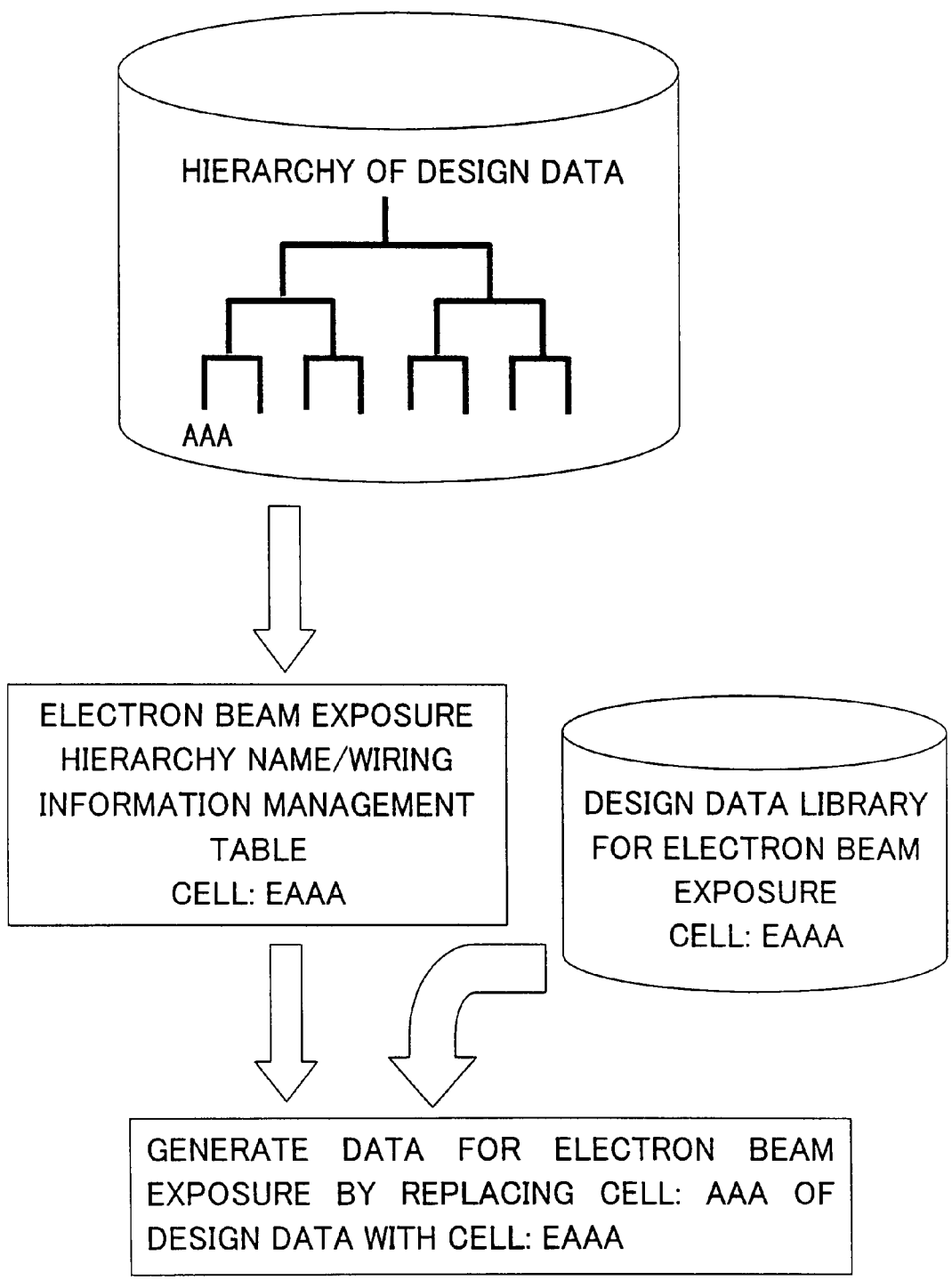
FIG. 15 is a diagram showing a concept of a replacing process.

FIG. 15 is a diagram showing a concept of the replacing process. As shown in FIG. 15, the design data of the semiconductor device is generally structured by hierarchically combining cells each identified by hierarchy name/wiring information (which is also referred to as a cell name). FIG. 15 shows a cell identified by a cell name "AAA".

On the other hand, the design data library for the electron beam exposure is stored with the data modified in the process 1. The hierarchy name in the design data library for the electron beam exposure is a name with "E" prefixed to the head of the hierarchy name in the design data. Furthermore, in the electron beam exposure hierarchy name/wiring information management table, the cell with the data modified in the process 1 is defined by a name with "E" prefixed to the head of the hierarchy name in the design data in the same way as in the case of the hierarchy name in the design data library for the electron beam exposure. Accordingly, the data generating apparatus compares the hierarchy name in the design data with the hierarchy name in the electron beam exposure hierarchy name/wiring information management table. Then, the data generating apparatus, if the corresponding hierarchy name exists, reads the data having this hierarchy name from the design data library for the electron beam exposure, and may simply replace this data with the data having the corresponding hierarchy name in the design data.

FIG. 16 shows a data example of the electron beam exposure hierarchy name/wiring information management table. In the table in FIG. 16, a first row is used for the convenience's sake as a title row explicitly showing a structure of a record in the table. Hence, substantial elements of the data in this table are given from the second row onward in the table in FIG. 16.

As shown in FIG. 16, each row has three elements specified by hierarchy name/wiring information, an address and a data size. The hierarchy name/wiring information is a name that is unique throughout the hierarchy or the design data identifying the wiring information, which are associated with each row. The address is an address in a file stored with the design data. The data size is a data size (quantity) of the pattern data that defines the layer or the pattern of the wiring, which are associated with each row.

Accordingly, the data generating apparatus, when the hierarchy name is given, accesses the electron beam exposure hierarchy name/wiring information management table, and gets thereby able to acquire a head address and a data size of the pattern data defining the pattern associated with this hierarchy name and to read the corresponding pattern.

Figure 17:
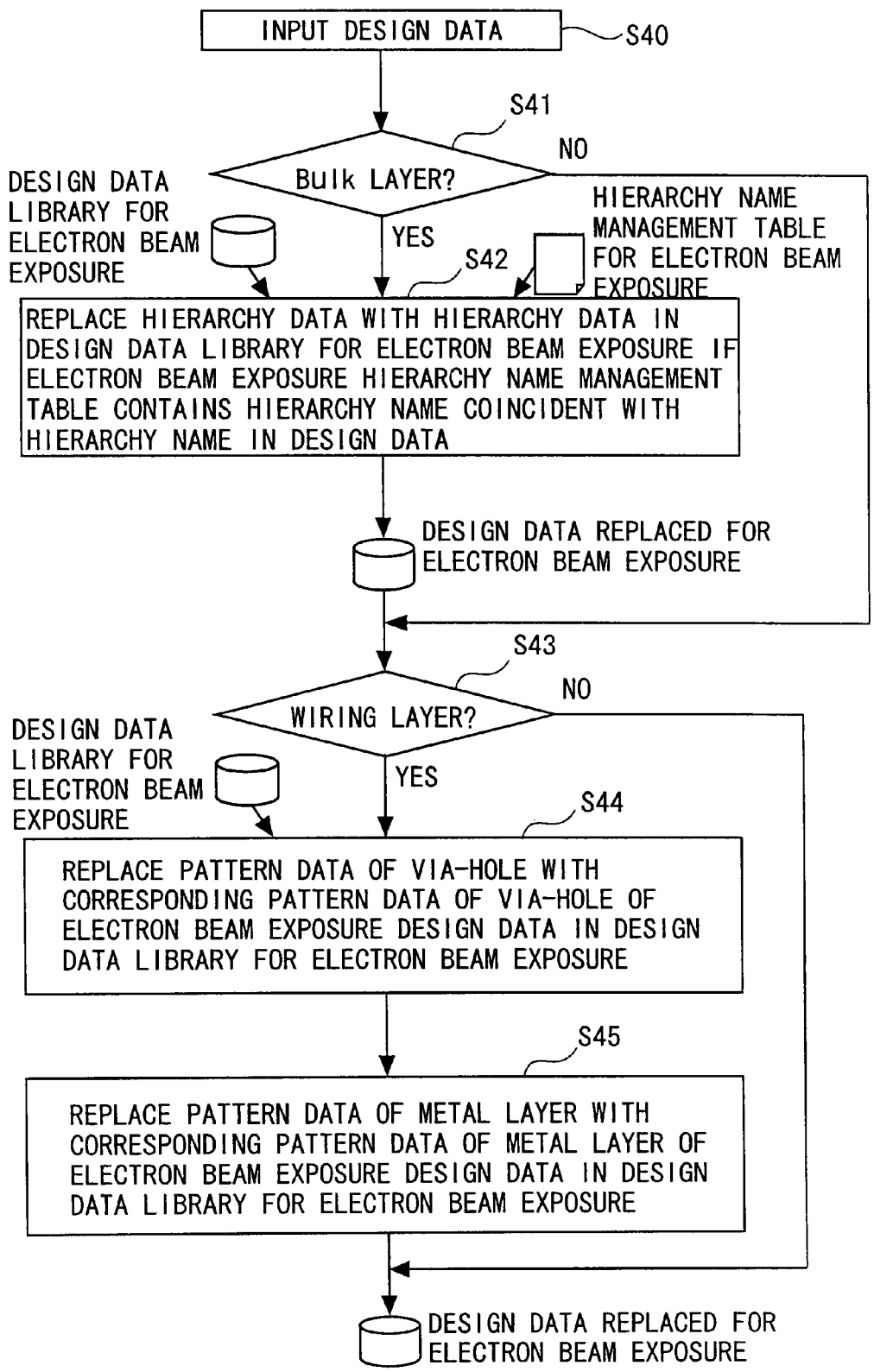
FIG. 17 is a flowchart showing the replacing process.

FIG. 17 is a flowchart showing the replacing process. In this process, the data generating apparatus inputs the design data (S40). The data generating apparatus judges whether or not a Bulk layer exists in the inputted design data (S41). Herein, the Bulk layer connotes a layer containing an elemental device such as a transistor and represents, e.g., a source/drain layer and a gate layer. On the other hand, a wiring layer, a via-hole layer, a cover layer, etc, which connect the elemental device to the elemental device, do not come under a category of the Bulk layer.

When the Bulk layer exists, the data generating apparatus executes the replacement on the unit of a cell library (S42). More specifically, the data generating apparatus compares the hierarchy name in the design data with a second character and subsequent characters of the hierarchy name in the electron beam exposure hierarchy name/wiring information management table. If there is the coincident hierarchy name, the data generating apparatus replaces this hierarchy data in the design data with the hierarchy data specified by the coincident hierarchy name in the design data library for the electron beam exposure. When finishing the processes about all of the hierarchy data, it follows that the data generating apparatus outputs such a piece of design data that the Bulk layer in the design data is replaced with the Bulk layer for the electron beam exposure.

Next, the data generating apparatus judges whether or not the design data contains the wiring layer (S43). If the design data contains the wiring layer, the data generating apparatus executes the replacement on the unit of the via-hole layer and the metal layer.

Herein, the via-hole layer and the metal layer are each identified by a layer number defined in the design data. To be more specific, the data generating apparatus searches for the layer number of the via-hole layer existing in the electron beam exposure hierarchy name/wiring information management table by use of layer number information of the via-hole layer in the design data. Then, the data generating apparatus obtains, from this layer number, a head address of the data stored in the design data library for the electron beam exposure. Subsequently, the data generating apparatus replaces the data designated by the layer number information in the design data with the data read from the head address (S44). FIG. 5A shows an example of pre-replacement via-hole data and an example of post-replacement via-hole data. The pre-replacement via-hole pattern takes a rectangle. By contrast, the post-replacement via-hole pattern take a trapezoidal shape in which rounded edge portions formed by the light exposure are reflected in the side portions of the original rectangle, resulting in a polygonal pattern having eight vertexes as a whole of the via-hole.

When finishing the process about the data of the via-hole layer, the data generating apparatus performs the replacement of the metal layer. Namely, the data generating apparatus searches for the layer number of the via-hole layer existing in the electron beam exposure hierarchy name/wiring information management table by use of the layer number information of the metal layer within the design data. Then, the data generating apparatus obtains, from this layer number, the head address of the data stored in the design data library for the electron beam exposure. Subsequently, the data generating apparatus replaces the data designated by the layer number information in the design data with the data read from the head address.

Figure 18:
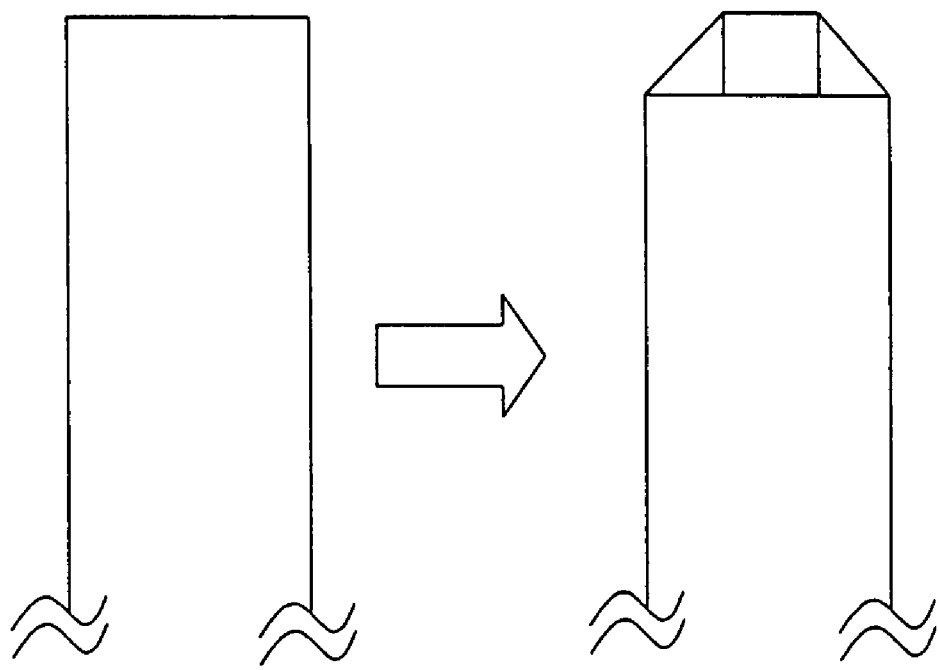
FIG. 18 is a diagram showing an example of a pre-replacement metal layer and an example of a post-replacement metal layer.

Then, the data generating apparatus finishes the replacement with respect to the data of the metal layer, and outputs the design data replaced for the electron beam exposure (S45). FIG. 18 illustrates an example of a pre-replacement metal layer pattern and an example of a post-replacement metal layer pattern. The pre-replacement metal layer pattern is formed so that its tip portion takes substantially an oblong. By contrast, the post-replacement metal layer pattern takes a trapezoidal shape in which rounded edge portions formed by the light exposure are reflected.

It is to be noted that if it is externally designated whether the Bulk layer, the via-hole layer and the metal layer can be replaced or not, the operation may simply follow the external instruction.

As described above, in the data generating apparatus in the present embodiment, the light exposure simulator and the electron beam exposure simulator calculate the resist shape in the case of the design data undergoing the light exposure and the resist shape in the case of undergoing the electron beam exposure, and obtain the difference therebetween. Then, the shape of the design data for the electron beam exposure is changed so that the difference becomes smaller than the predetermined allowable value. The thus shape-changed data is registered as the design data library for the electron beam exposure. Then, on the occasion of generating the exposure data for the electron beam exposure, the cell, the via-hole and the wiring in the design data are replaced with the shape-changed data in the design data library for the electron beam exposure. Thus, even in such a case that the resist on the semiconductor substrate is exposed to the electron beams, the same resist shape as by the light exposure can be acquired.

Further, the design data library for the electron beam exposure is created and managed per technology node determined based on the design rule such as the line width and the pattern density. Accordingly, in the light exposure simulation, the corrections for the light exposure such as the generation of the dummy pattern for the planarization, the optical proximity effect correction, the local flare correction and the microloading effect correction for etching can be carried out by setting the line width and the pattern density corresponding to the technology node.

Moreover, in the electron beam exposure simulation, the corrections for the electron beam exposure such as the optical proximity effect correction, the stitching correction and the microloading effect correction for etching can be conducted by setting the line width and the pattern density corresponding to the technology node.

MODIFIED EXAMPLE

In the present embodiment, the embodiment has been described by exemplifying the light exposure technology and the electron beam exposure technology and can be also applied to combinations of other types of technologies.

<<Recording Medium Readable by Computer>>

A program for making a computer, other machines, devices (which will hereinafter be referred to as the computer etc) actualize any one of the functions given above, can be recorded on a recording medium readable by the computer etc. Then, the computer etc is made to read and execute the program on this recording medium, whereby the function thereof can be provided.

Herein, the recording medium readable by the computer etc connotes a recording medium capable of storing information such as data and programs electrically, magnetically, optically, mechanically or by chemical action, which can be read from the computer etc. Among these recording mediums, for example, a flexible disc, a magneto-optic disc, a CD-ROM, a CD-R/W, a DVD, a DAT, an 8 mm tape, a memory card, etc are given as those demountable from the computer etc.

Further, a hard disk, a ROM (Read-Only Memory), etc are given as the recording mediums fixed within the computer etc.

What is claimed is:

1. A data generating apparatus, comprising:
  a light pattern storage unit stored with a shape of a light exposure pattern formed on a substrate by a light exposure on the basis of design data of a semiconductor device;
  an electron beam exposure pattern storage unit stored with a shape of an electron beam exposure pattern formed on the substrate by an electron beam exposure on the basis of the design data;
  a light-electron difference extracting unit to extract light-electron difference information representing a difference portion between the shape of the light exposure pattern and the shape of the electron beam exposure pattern; and
  a data modifying unit to modify the design data in accordance with the light-electron difference information.

2. A data generating apparatus according to claim 1, wherein the data modifying unit changes the design data for modifying shape specified by the design data to the shape of the light exposure pattern in accordance with the difference information.

3. A data generating apparatus according to claim 2, further comprising:
  a light exposure data generating unit to generate light exposure data used for a light exposure simulation from the design data; and
  an electron beam exposure data generating unit to generate electron beam exposure data used for an electron beam exposure simulation from the design data or from the changed design data for modifying the shape,
  wherein the light exposure data generating unit executes a correcting process including at least one of generation of a dummy pattern for planarization, an optical proximity effect correction, a local flare correction and a microloading effect correction for etching, and
  the electron beam exposure data generating unit executes a correcting process including at least one of the generation of the dummy pattern for the planarization, the proximity effect correction, a stitching correction and the microloading effect correction for etching.

4. A data generating apparatus according to claim 3, further comprising:
  a light exposure simulation unit to generate a shape of the light exposure pattern from the light exposure data; and
  an electron beam exposure simulation unit to generate a shape of the electron beam exposure pattern from the electron beam exposure data.

5. A data generating apparatus according to claim 2, wherein the difference extracting unit includes a restraining unit that restrains the difference information from being extracted if a dimension of the difference portion is smaller than a predetermined allowable value.

6. A data generating apparatus according to claim 2, further comprising a library storage unit for an electron beam exposure, stored with data that is changed for modifying the shape into a shape simulating the light exposure pattern from partial circuit data used in common to a plurality of semiconductor devices in the design data.

7. A data generating apparatus according to claim 6, further comprising:
  a replacing unit to replace the partial circuit data with the data stored in the library storage unit for the electron beam exposure with respect to design data of the semiconductor device that is formed by referring to the partial circuit data; and
  a converting unit to convert, into exposure data for the electron beam exposure, the design data of the semiconductor device in which the partial circuit data is replaced with the data stored in the library storage unit for the electron beam exposure.

8. A data generating apparatus according to claim 6, wherein the design data contains via-hole data and wiring data, and
  the library storage unit for the electron beam exposure is stored with such a piece of data that the via-hole data is changed for modifying the shape into a shape simulating the light exposure pattern and with such a piece of data that the wiring data is changed for modifying the shape into a shape simulating the light exposure pattern.

9. A data generating apparatus according to claim 2, wherein the data modifying unit includes:
  a light increment generating unit to generate a light increment pattern remaining as a result of subtracting the shape of the electron beam exposure pattern from the shape of the light exposure pattern;
  an electron beam increment generating unit to generate an electron beam increment pattern remaining as a result of subtracting the shape of the light exposure pattern from the shape of the electron beam exposure pattern; and
  an arithmetic unit to add data based on the light increment pattern to the design data, and to subtract data based on the electron beam increment pattern from the design data.

10. A data generating apparatus according to claim 9, further comprising:
  a first setting unit setting a piece of identifying information at an identifying side corresponding to a boundary line between the light exposure pattern and the electron beam exposure pattern in external shape sides forming an external shape of the light increment pattern;
  a second setting unit setting a piece of identifying information at an identifying side other than the side corresponding to the boundary line between the light exposure pattern and the electron beam exposure pattern in external shape sides forming an external shape of the electron beam exposure pattern; and
  a position correcting unit locating the identifying side in a position of a correction-undergone side located in the vicinity of the identifying side, among external shape sides forming a pattern contained in the design data or the changed design data for modifying the shape.

11. A semiconductor manufacturing method, comprising:
a data generating process including:
- acquiring a simulation light pattern that simulates a shape of a light exposure pattern formed on a substrate on the basis of design data of a semiconductor device;
- acquiring a simulation electron beam exposure pattern that simulates a shape of an electron beam exposure pattern formed by an electron beam exposure on the substrate on the basis of the design data;
- extracting light-electron difference information representing a shape difference portion between the simulation light pattern and the simulation electron beam exposure pattern; and
- acquiring changed design data for modifying shape by changing the design data in accordance with the light-electron difference information; and
- conducting the electron beam exposure on the substrate by use of the changed design data for modifying the shape.

12. A semiconductor manufacturing method according to claim 11, wherein the data generating process further includes:
- generating light exposure data used for a light exposure simulation from the design data; and
- generating electron beam exposure data used for an electron beam exposure simulation from the design data or from the changed design data for modifying the shape,
- wherein the generating light exposure data includes executing a correcting process including at least one of generation of a dummy pattern for planarization, an optical proximity effect correction, a local flare correction and a microloading effect correction for etching, and
- the generating electron beam exposure data includes executing a correcting process including at least one of the generation of the dummy pattern for the planarization, the proximity effect correction, a stitching correction and the microloading effect correction for etching.

13. A semiconductor manufacturing method according to claim 12, wherein the data generating process further includes:
- generating a shape of the light exposure pattern from the light exposure data; and
- generating a shape of the electron beam exposure pattern from the electron beam exposure data.

14. A semiconductor manufacturing method according to claim 11, wherein the extracting difference information includes restraining the difference information from being extracted if a dimension of the difference portion is smaller than a predetermined allowable value.

15. A semiconductor manufacturing method according to claim 11, wherein the data generating process further includes storing a library storage unit for an electron beam exposure with data that is changed for modifying the shape into a shape simulating the light exposure pattern from partial circuit data used in common to a plurality of semiconductor devices in the design data.

16. A semiconductor manufacturing method according to claim 15, wherein the data generating process further includes:
- replacing the partial circuit data with the data stored in the library storage unit for the electron beam exposure with respect to design data of the semiconductor device that is formed by referring to the partial circuit data; and
- converting, into exposure data for the electron beam exposure, the design data of the semiconductor device in which the partial circuit data is replaced with the data stored in the library storage unit for the electron beam exposure.

17. A semiconductor manufacturing method according to claim 15, wherein the design data contains via-hole data and wiring data, and
- the library storage unit for the electron beam exposure is stored with such a piece of data that the via-hole data is changed for modifying the shape into a shape simulating the light exposure pattern and with such a piece of data that the wiring data is changed for modifying the shape into a shape simulating the light exposure pattern.

18. A semiconductor manufacturing method according to claim 11, wherein the data generating process further includes:
- generating a light increment pattern remaining as a result of subtracting the shape of the electron beam exposure pattern from the shape of the light exposure pattern;
- generating an electron beam increment pattern remaining as a result of subtracting the shape of the light exposure pattern from the shape of the electron beam exposure pattern; and
- adding data based on the light increment pattern to the design data, and subtracting data based on the electron beam increment pattern from the design data.

19. A semiconductor manufacturing method according to claim 18, wherein the data generating process further includes:
- a first setting step of setting a piece of identifying information at an identifying side corresponding to a boundary line between the light exposure pattern and the electron beam exposure pattern in external shape sides forming an external shape of the light increment pattern;
- a second setting step of setting a piece of identifying information at an identifying side other than the side corresponding to the boundary line between the light exposure pattern and the electron beam exposure pattern in external shape sides forming an external shape of the electron beam exposure pattern; and
- locating the identifying side in a position of a correction-undergone side located in the vicinity of the identifying side in external shape sides forming a pattern contained in the design data or the changed design data for modifying the shape.

\* \* \* \* \*

UNITED STATES PATENT AND TRADEMARK OFFICE
CERTIFICATE OF CORRECTION

| | | |
|---|---|---|
| PATENT NO. | : 8,032,844 B2 | Page 1 of 1 |
| APPLICATION NO. | : 11/844541 | |
| DATED | : October 4, 2011 | |
| INVENTOR(S) | : Hiromi Hoshino | |

It is certified that error appears in the above-identified patent and that said Letters Patent is hereby corrected as shown below:

Title Page, Item (54) and at Column 1, line 6,

In the Title:

"RECODED" should read --RECORDED--.

Signed and Sealed this
Twenty-second Day of November, 2011

David J. Kappos
*Director of the United States Patent and Trademark Office*